United States Patent
Masuda et al.

(10) Patent No.: US 9,817,137 B2
(45) Date of Patent: Nov. 14, 2017

(54) ENERGY RAY DETECTOR

(71) Applicant: Sharp Kabushiki Kaisha, Osaka (JP)

(72) Inventors: Ryohichi Masuda, Osaka (JP); Mikio Katayama, Osaka (JP); Hidenori Kawanishi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/036,821

(22) PCT Filed: Nov. 26, 2014

(86) PCT No.: PCT/JP2014/081229
§ 371 (c)(1),
(2) Date: May 16, 2016

(87) PCT Pub. No.: WO2015/107777
PCT Pub. Date: Jul. 23, 2015

(65) Prior Publication Data
US 2016/0313458 A1    Oct. 27, 2016

(30) Foreign Application Priority Data

Jan. 15, 2014    (JP) .................................. 2014-005326

(51) Int. Cl.
*G01T 1/24*    (2006.01)
*H01L 27/146*    (2006.01)

(52) U.S. Cl.
CPC ........ *G01T 1/247* (2013.01); *H01L 27/14612* (2013.01); *H01L 27/14658* (2013.01)

(58) Field of Classification Search
CPC ................... G01T 1/24; G01T 1/247

USPC ....................... 250/370.01, 370.07
See application file for complete search history.

(56) References Cited

U.S. PATENT DOCUMENTS

| 2009/0146068 A1* | 6/2009 | Agarwal ................. G01T 1/026 250/370.07 |
| 2010/0320391 A1* | 12/2010 | Antonuk ............. H01L 27/1462 250/366 |

FOREIGN PATENT DOCUMENTS

| JP | 2002-040145 A | 2/2002 |
| JP | 2007-173861 A | 7/2007 |
| JP | 2008-520999 A | 6/2008 |
| JP | 2013-003094 A | 1/2013 |

OTHER PUBLICATIONS

International Search Report of PCT/JP2014/081229 dated Mar. 3, 2015.

(Continued)

*Primary Examiner* — David Porta
*Assistant Examiner* — Meenakshi Sahu
(74) *Attorney, Agent, or Firm* — Birch, Stewart, Kolasch & Birch, LLP

(57) ABSTRACT

A thin, lightweight, and highly reliable energy ray detector that enables high-speed reading is provided. An energy ray detector (1) includes TFTs (20) that are arranged in a grid pattern and that each have an active layer formed of a semiconductor having an electrical property changing in accordance with the amount of applied energy ray radiation, and a property detection circuit unit (5) and a controller (60) that detect information regarding the energy ray radiation from changes in the electrical property of the TFTs (20).

14 Claims, 16 Drawing Sheets

(56) References Cited

OTHER PUBLICATIONS

Martin, M. N. et al., FGMOS Dosimetry: Design and Implementation, IEEE Transaction on Nuclear Science IEEE, Dec. 2001, vol. 48, No. 6, pp. 2050-2055, pp. 2052, paragraph III-IV.

* cited by examiner

FIG. 19
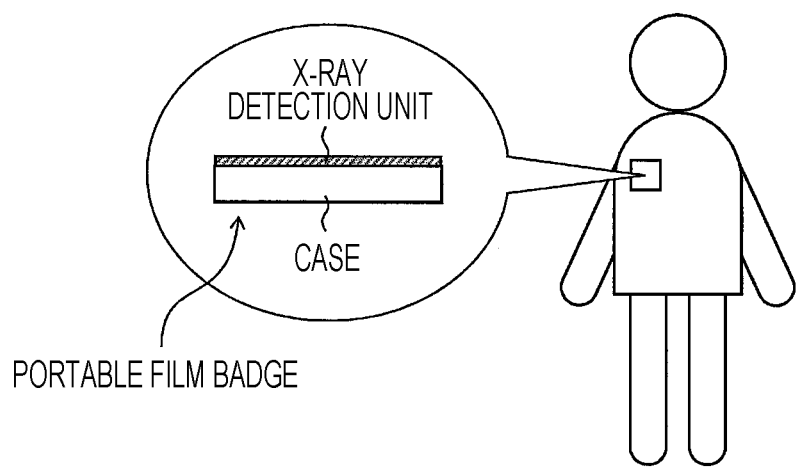
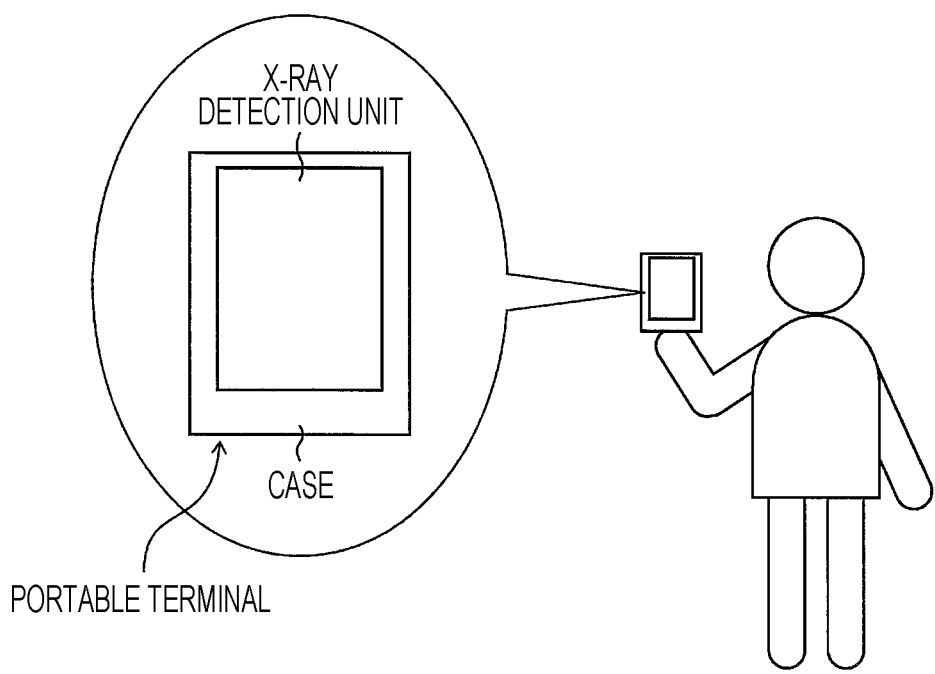

ENERGY RAY DETECTOR

TECHNICAL FIELD

The present invention relates to an energy ray detector including semiconductors arranged in a grid pattern to detect energy ray radiation from changes in an electrical property of the semiconductors.

BACKGROUND ART

As energy ray detection devices that detect energy rays (radiation), such as X-rays, two major types of detection devices are known. One is a scintillation detection device that employs an indirect conversion scheme in which energy rays are converted into light with a scintillator, and the light is converted into electric signals with a photoelectric transducer, such as a photodiode. The other is a semiconductor detection device that employs a direct conversion scheme in which energy rays are directly converted into electric charges with a semiconductor layer.

However, in the scintillation detection device, it is necessary to once convert incident energy rays into light and thereafter convert the light into electric signals with a photoelectric transducer, such as a photomultiplier tube or a photodiode, for reading, resulting in reduced energy conversion efficiency. The scintillation detection device requires a large amount of energy in order to excite molecules and, for example, requires about 100 eV worth of energy in order to obtain one carrier.

In contrast, the semiconductor detection device only requires about several eV worth of energy in order to obtain one pair of carriers and can obtain, with the same amount of energy, a larger number of carriers than the scintillation detection device. Unlike the scintillation detection device, the semiconductor detection device is not affected by optical scattering within a scintillator, and therefore, provides a high resolution. Further, in the semiconductor detection device, carriers propagate in the semiconductor at a speed higher than in the scintillation detection device, resulting in an excellent timing property.

Accordingly, the semiconductor detection device that employs the direct conversion scheme is often used for flat-panel-type radiation detection devices currently. Such flat-panel-type radiation detection devices are disclosed in PTL 1 and PTL 2, for example.

The flat-panel-type radiation detection device employing the direct conversion scheme includes a substantially square active matrix substrate, a substantially square semiconductor layer (semiconductor substrate), and a bias electrode.

On the active matrix substrate, a plurality of pixels are arranged in a grid pattern. Each pixel on the active matrix substrate includes electrode lines in an XY matrix constituted by one of a plurality of gate lines and one of a plurality of source lines, a TFT (thin film transistor), and a Cs (charge storage capacitor) formed on the active matrix substrate.

As the active matrix substrate, an active matrix substrate formed in the process of manufacturing a liquid crystal display can be used.

For example, each pixel on an active matrix substrate used for an AMLCD (active matrix liquid crystal display) includes a transistor formed of a-Si (amorphous silicon) or p-Si (polysilicon), XY matrix electrodes, and a Cs. Therefore, this active matrix substrate can be easily used as the active matrix substrate for the flat-panel-type radiation detection device only by making a minor design change.

The semiconductor layer is formed on the active matrix substrate while sharing the same center with the active matrix substrate. The bias electrode is formed on the substantially entire surface of the semiconductor layer opposite to the active matrix substrate.

For the semiconductor layer, a material exhibiting photoconductivity such that electric charges are generated in response to application of radiation, such as X-rays, is used. The photoconductivity described here refers to a property of generating electric charges in response to application of X-rays or the like.

For example, in PTL 1, a-Se (amorphous selenium), which has high dark resistance, which exhibits good photoconductivity in response to application of X-rays, and with which a film having a large area can be easily formed with vapor deposition, is used for the semiconductor layer. In PTL 2, cadmium telluride, which is a photoconductive film material that is crystalline (or polycrystalline) and that has excellent sensitivity (S/N ratio) to X-rays, is used for the semiconductor layer.

Here, functions of a conventional flat-panel-type radiation detection device using a semiconductor detection device are described.

When radiation, such as X-rays, is applied to the semiconductor layer formed of an a-Se film or the like, electric charges are generated within the semiconductor layer. If a voltage is applied to the bias electrode at this time, some of the electric charges generated within the semiconductor layer move towards the positive (+) potential side and some of the generated electric charges move towards the negative (−) potential side. As a result, the electric charges are stored in the Cs formed on the active matrix substrate.

The electric charges thus stored in the Cs can be extracted through the source line by making the transistor in the on state in accordance with an input signal from the gate line.

The electrode lines constituted by the gate electrode lines and the source lines, the transistors, the Css, and so on are all arranged in an XY matrix on the active matrix substrate.

Therefore, by sequentially scanning input signals over the gate lines, the TFTs are in the on state, and electric charges, which represent image information, stored in the Css are extracted through the source lines, so that two-dimensional X-ray image information can be obtained.

CITATION LIST

Patent Literature

PTL 1: Japanese Unexamined Patent Application Publication No. 2002-040145 (published on Feb. 6, 2002)

PTL 2: Japanese Unexamined Patent Application Publication No. 2007-173861 (published on Jul. 5, 2007)

PTL 3: Japanese Unexamined Patent Application Publication No. 2013-003094 (published on Jan. 7, 2013)

SUMMARY OF INVENTION

Technical Problem

Accordingly, the semiconductor detection device has above-described advantages unlike the scintillation detection device and is used as a flat-panel-type radiation detection device.

However, the semiconductor detection device has a shortcoming in that the semiconductor layer needs to have a sufficient layer thickness in order to absorb and detect radiation.

For example, in the flat-panel-type radiation detection device described above, a semiconductor layer having a thickness of about several hundred μm to 1 mm is formed in order to increase the X-ray absorption efficiency.

Among semiconductor materials, even if a-Se or cadmium telluride having a large absorption coefficient is used for the semiconductor layer as in PTL 1 or PTL 2, it is not possible to make the thickness of the semiconductor layer thinner. For example, even in a case where cadmium telluride is employed for the semiconductor layer as described in PTL 2, for example, the resulting layer thickness is within the range from 100 μm to 1 mm.

The active matrix substrate and the semiconductor layer having the bias electrode provided on the surface of the semiconductor layer opposite to the active matrix substrate are bonded together via an insulating layer resin.

Therefore, if the semiconductor detection device is used for a flat-panel-type radiation detection device, the thickness of the insulating resin formed on the active matrix substrate is different between an area in which the semiconductor layer is formed and a peripheral area in which the semiconductor layer is not formed on the active matrix substrate. That is, the thickness of the insulating resin formed in the area in which the semiconductor layer is not formed is thicker than the thickness of the insulating resin formed in the area in which the semiconductor layer is formed by the thickness of the semiconductor layer.

A resin material that is used as the insulating resin, such as a photo-curable resin, a thermosetting resin, or a two-part curable resin, experiences volume shrinkage of about 5 to 10% in association with a hardening reaction. For example, in a case where the thickness of the semiconductor layer is 1 mm, the thickness of the insulating resin differs by 1 mm between the area in which the semiconductor layer is formed and in the peripheral area. Therefore, in this case, the difference in the amount of hardening shrinkage of the insulating resin in the thickness direction reaches 50 to 100 μm or so between the area in which the semiconductor layer is formed and the peripheral area.

Accordingly, if the amount of hardening shrinkage of the insulating resin in the thickness direction differs between the area in which the semiconductor layer is formed and the peripheral area on the active matrix substrate, a large internal stress is accumulated in the insulating resin in the vicinity of the boundary between the area in which the semiconductor layer is formed in a lower layer and the area in which the semiconductor layer is not formed.

As described above, the semiconductor layer is formed on the active matrix substrate while sharing the same center with the active matrix substrate. Therefore, the internal stress is accumulated in the insulating resin in the peripheral part of the active matrix substrate.

As a result, in the conventional flat-panel-type radiation detection device, the active matrix substrate warps in the peripheral part of the active matrix substrate due to the internal stress accumulated in the insulating resin, and the flat-panel-type radiation detection device becomes less impact-resistant, for example, and lacks reliability, which is a problem.

Note that PTL 3 discloses a MOSFET radiation dosimeter including a radiation integrated circuit having metal oxide semiconductor field-effect transistors (MOSFETs), as a personal radiation dosimeter used by workers in medical, nuclear, and other industries.

The MOSFET radiation dosimeter is generally known as a radiation field-effect transistor (RADFET), and a radiation dose is measured in PTL 3 by measuring a shift in the threshold voltage of a RADFET caused by radiation.

If the RADFET described in PTL 3 is used for a radiation dosimeter, it is not necessary to bond the thick semiconductor layer (semiconductor substrate) to the active matrix substrate via the insulating resin in order to detect radiation as described in PTL 1 and PTL 2, and the above-described problem does not arise.

However, according to PTL 3, for a pair of RADFETs, loads connected to the respective RADFETs are necessary in order to measure the threshold voltage.

Therefore, if the radiation integrated circuit described in PTL 3 is used for a flat-panel-type radiation detection device including radiation detection elements arranged in a matrix, a larger number of elements are used to measure radiation, and the radiation detection device itself becomes larger, which causes another problem.

In the conventional flat-panel-type radiation detection device using the semiconductor detection device, electric charges generated within the semiconductor layer in response to application of radiation to the semiconductor layer are stored in the Css, and the stored electric charges are extracted through the source lines to thereby detect the radiation. Therefore, it is not possible to read information before radiation is applied to the semiconductor layer for a long time and the Css are sufficiently charged. As a result, high-speed reading of information is not possible.

The present invention has been made in view of the above-described problems, and an object thereof is to provide a thin, lightweight, and highly reliable energy ray detector that enables high-speed reading.

Solution to Problem

In order to solve the above-described problems, an energy ray detector according to one aspect of the present invention includes semiconductors that are arranged in a grid pattern and that have an electrical property changing in accordance with the amounts of applied energy ray radiation, and a detection unit that detects information regarding the energy ray radiation from changes in the electrical property of the semiconductors.

Advantageous Effects of Invention

According to one aspect of the present invention, information regarding energy ray radiation is detected from changes in an electrical property of the semiconductors which are arranged in a grid pattern and in which the electrical property changes in accordance with the amounts of applied energy ray radiation. Accordingly, the semiconductors need not have a thicker film thickness unlike the case in PTL 1 and PTL 2 where electric charges generated within the semiconductor film in response to application of radiation (energy ray radiation) to the semiconductor film are stored in the charge storage capacitors, and the stored electric charges are extracted to thereby detect the radiation. As a consequence, the semiconductors and the entire device can be made thinner.

Since the semiconductors can be made thinner, the problem does not arise in which a large internal stress is accumulated in the vicinity of the boundary between the area in which the semiconductor layer is formed and the area in which the semiconductor layer is not formed due to the difference in the amount of hardening shrinkage in the thickness, which may result in the lack of reliability, such as warps and lower impact-resistance.

In the case where electric charges generated within the semiconductor film in response to application of radiation to the semiconductor film are stored in the charge storage capacitors, and the stored electric charges are extracted to thereby detect the radiation as described in PTL 1 and PTL 2, it is not possible to read information before radiation is applied for a long time and the charge storage capacitors are sufficiently charged. However, the energy ray detector according to one aspect of the present invention does not require such a charge time, and therefore, enables high-speed reading of information.

The energy ray detector according to one aspect of the present invention does not require a pair of radiation field-effect transistors and loads connected to the respective transistors in order to detect radiation unlike PTL 3. In the energy ray detector according to one aspect of the present invention, the semiconductors arranged in a grid pattern function as energy ray detection elements. Therefore, a small and lightweight energy ray detector having energy detection elements arranged in a grid pattern can be implemented.

As a consequence, according to one aspect of the present invention, a thin, lightweight, and highly reliable energy ray detector that enables high-speed reading can be provided.

BRIEF DESCRIPTION OF DRAWINGS

FIG. 19 is a schematic diagram illustrating an example of the overall configuration of a dosimeter according to the fifth embodiment.

DESCRIPTION OF EMBODIMENTS

Hereinafter, embodiments of the present invention will be described in detail.

<Overview of Embodiments>

An energy ray detector according to embodiments of the present invention is an energy ray detector (semiconductor energy ray detector) that includes semiconductors arranged in a grid pattern and detects energy ray radiation from changes in an electrical property of the semiconductors.

The energy ray detector according to embodiments of the present invention described below detects energy ray radiation by using the fact that an electrical property of the semiconductors changes in accordance with the amounts of energy ray radiation. Specifically, the energy ray detector is a flat-panel-type energy ray detector and detects changes in an electrical property of the semiconductors arranged in a grid pattern, the electrical property changing in response to energy ray radiation applied to the semiconductors, to thereby detect information regarding the energy ray radiation, such as the presence or absence of energy ray radiation (that is, applied energy ray radiation) and the amounts of energy ray radiation.

Examples of the energy ray include radiation. The types of radiation are not specifically limited, and the radiation may be a radio wave, such as an X-ray or a γ-ray, a charged-particle beam, such as an α-ray, a β-ray, an electron beam, a proton beam, or a deuteron beam, or an uncharged-particle beam, such as a neutron beam.

However, the energy ray is not limited to radiation, and may be an energy ray other than radiation, such as a specific electromagnetic wave, or may be an energy ray formed of radiation and so on.

In a case where a property of the semiconductors that are used similarly changes in response to visible light or an infrared ray in addition to radiation, the energy ray detector can be used as a two-dimensional image detection device using visible light or an infrared ray.

<Principle of Energy Ray Measurement>

First, the principle of energy ray measurement using the energy ray detector according to embodiments of the present invention is described below with reference to FIG. 2 to FIG. 5.

As described above, when energy ray radiation is applied to a transistor having an active layer formed of a semiconductor, an electrical property of the transistor to which the energy ray radiation has been applied changes. Specifically, an electrical property of a transistor having an active layer formed of an oxide semiconductor significantly changes in accordance with the amount of applied energy ray radiation.

Figure 2:
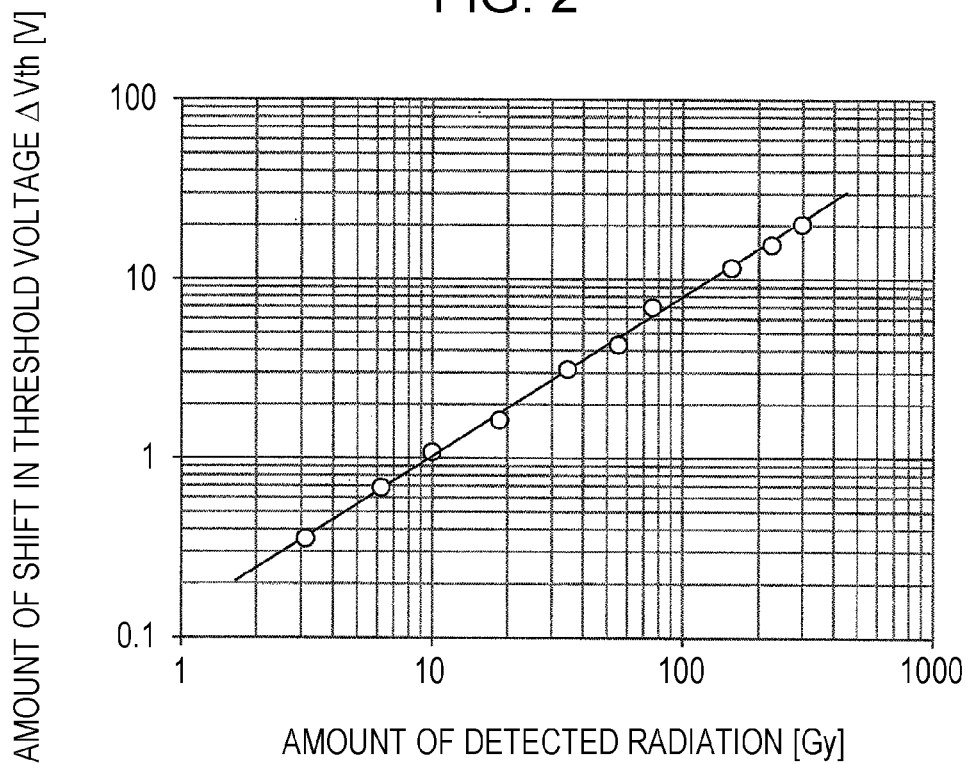
FIG. 2 is a graph illustrating an example of a relationship between the amount of shift in the threshold voltage of a transistor according to the first embodiment when radiation is applied to the transistor, and the amount of detected radiation.

FIG. 2 is a graph illustrating an example of a relationship between the amount of shift in the threshold voltage of a transistor having an active layer formed of a semiconductor when radiation, such as an X-ray, is applied to the transistor, and the amount of detected radiation.

As illustrated in FIG. 2, when radiation is applied to a transistor having an active layer formed of a semiconductor, the amount of shift (transition) in the threshold voltage of the transistor linearly changes in accordance with the amount of applied radiation. For example, in a case where an MOSFET (metal-oxide-semiconductor filed-effect transistor) having an active layer made of Si is used as the transistor, the threshold voltage transitions in the negative direction in a case of an n-type transistor (n-channel transistor) and the threshold voltage transitions in the positive direction in a case of a p-type transistor (p-channel transistor) in accordance with the amount of applied radiation.

As described above, the threshold voltage of the transistor transitions by a larger amount as the amount of applied radiation increases. Therefore, the radiation dose can be detected by measuring the amount of change (amount of transition) in the threshold voltage.

By using the above-described characteristics, it is possible to detect radiation by adjusting a voltage applied to the gate electrode so that the transistor is in the off state when no radiation is applied and so that the transistor is in the on state as a result of a shift in the threshold when radiation is applied and by monitoring the output value from the transistor.

The threshold voltage of a transistor located in an area to which a large amount of radiation is applied transitions to a large degree, and that of a transistor located in an area in which the radiation dose is small transitions to a small degree. As described above, the amount of transition linearly changes in accordance with the amount of applied radiation. Therefore, the energy distribution of applied radiation can be detected by arranging transistors in a grid pattern and detecting the amounts of radiation applied to the respective transistors from the amounts of transition in the threshold voltages of the transistors.

However, it is not easy to directly measure the threshold voltages of the transistors.

Accordingly, a case is described below, for example, where a fluctuation in a property of a transistor due to a fluctuation in the threshold voltage of the transistor is electrically measured, and the radiation dose is determined from a relationship between a value obtained as a result of measurement and a corresponding radiation dose.

Note that, as a matter of course, radiation may be detected from the threshold voltage of a transistor as illustrated in FIG. 2, and such a case of detecting radiation from the threshold voltage of a transistor is not denied in embodiments of the present invention.

A convenient way to electrically measure a fluctuation in a property of a transistor due to a fluctuation in the threshold voltage is to measure the electric current (drain current) that flows through the transistor, for example.

Figure 3:
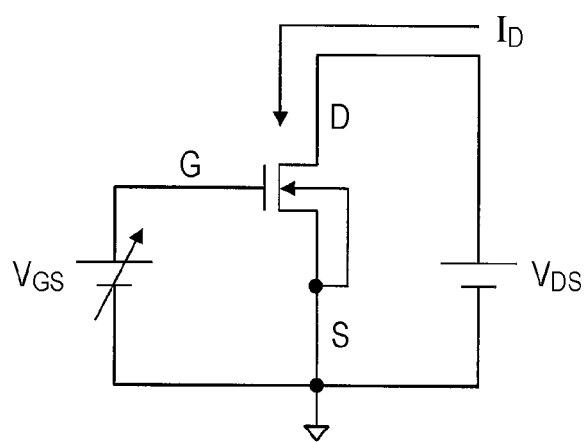
FIG. 3 is a diagram illustrating a circuit configuration of the transistor according to the first embodiment.

FIG. 3 illustrates a circuit configuration of the transistor according to the first embodiment and other embodiments described below that is used to measure a fluctuation in a property of the transistor. A case is described below, for example, where an n-type transistor having an active layer formed of a semiconductor is used as the transistor.

In FIG. 3, G, D, and S represent the gate electrode, the drain electrode, and the source electrode respectively, and the source electrode S is connected to GND (ground).

Figure 4:
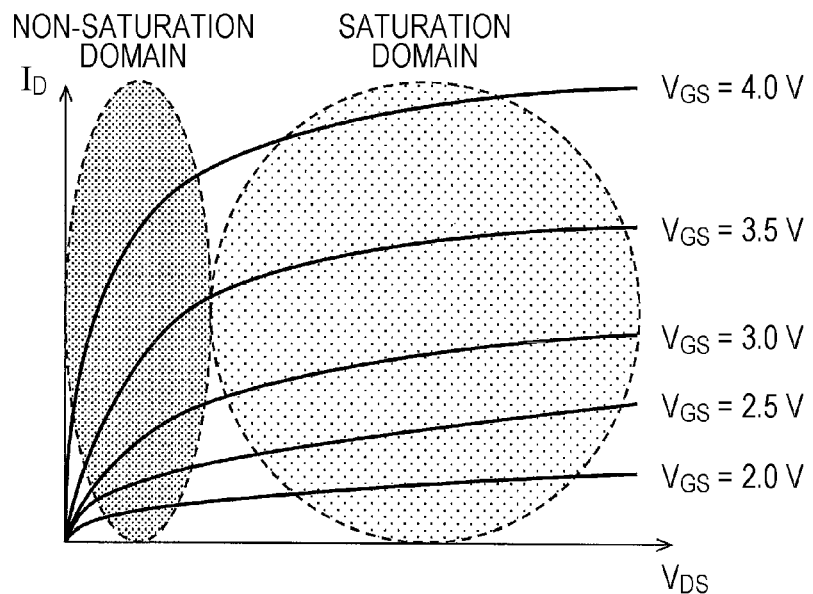
FIG. 4 is a graph illustrating relationships between the drain-source voltage and the drain current when the gate-source voltage of the transistor illustrated in FIG. 3 changes.

FIG. 4 is a graph illustrating relationships between the drain-source voltage $V_{DS}$ and the drain current $I_D$ when the gate-source voltage $V_{GS}$ of the transistor illustrated in FIG. 3 changes (parameter). As illustrated in FIG. 3, in response to the drain-source voltage $V_{DS}$, the drain current $I_D$ that corresponds to the gate-source voltage $V_{GS}$ flows into the drain electrode D. As illustrated in FIG. 4, the drain current $I_D$ increases as the gate-source voltage $V_{GS}$ increases.

As illustrated in FIG. 4, as the drain-source voltage $V_{DS}$ increases, the drain current $I_D$ initially increases and thereafter remains almost constant. Therefore, the operation domain of the transistor includes a non-saturation domain (linear domain) in which the drain-source voltage $V_{DS}$ is lower and the drain current $I_D$ linearly changes in accordance with a change in the drain-source voltage $V_{DS}$, and a saturation domain in which the drain current $I_D$ remains almost unchanged even if the drain-source voltage $V_{DS}$ changes.

In the embodiments described below, a plurality of transistors are arranged in a grid pattern, and the amounts of radiation applied to the respective transistors are detected from the amounts of transition in the threshold voltages of the transistors, as described above. Therefore, the drain-source voltage $V_{DS}$ is set within the range of the saturation domain so that the drain current $I_D$ changes a little even if the drain-source voltage $V_{DS}$ differs (varies) among the transistors.

Figure 5:
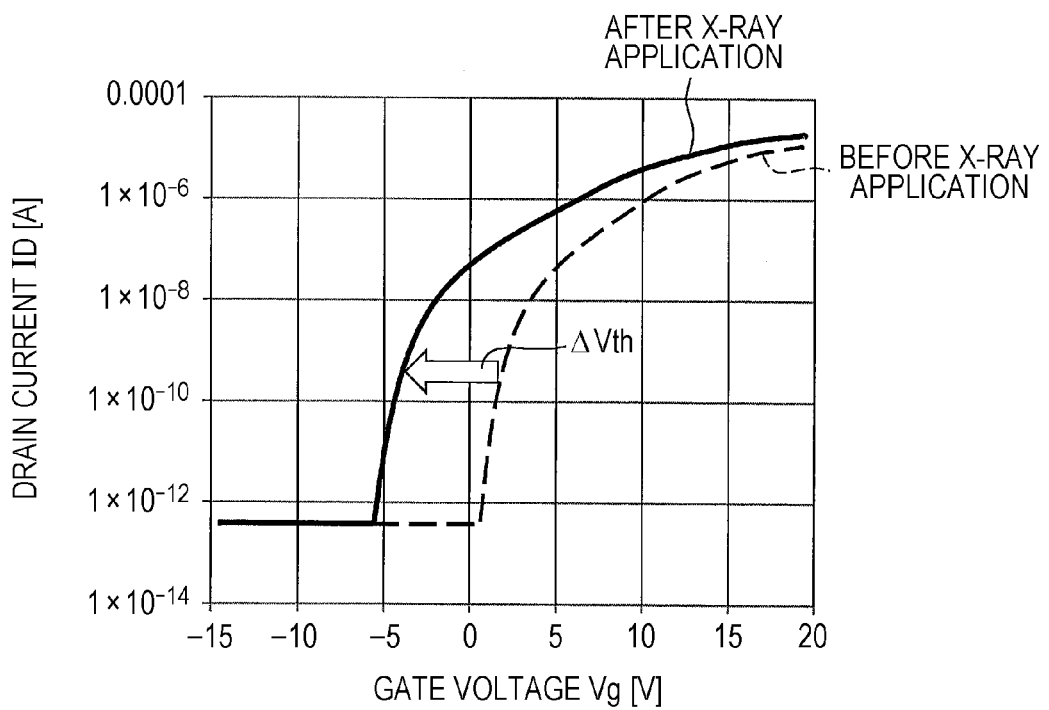
FIG. 5 is a graph illustrating an example electrical property of the transistor illustrated in FIG. 3 when radiation is applied to the transistor.

FIG. 5 is a graph illustrating an example electrical property of the transistor illustrated in FIG. 3 when radiation, such as an X-ray, is applied to the transistor, for example. In FIG. 5, the horizontal axis represents the gate voltage Vg, and the vertical axis represents the drain current $I_D$ of the transistor.

When radiation is applied to the transistor illustrated in FIG. 3, the threshold voltage of the transistor transitions towards the minus side, and the electric current (drain current $I_D$) that flows through the transistor increases accordingly. In a case where a p-type transistor is used, the electric current (drain current) that flows through the transistor decreases in contrast to the case of using the n-type transistor illustrated in FIG. 3.

As represented by a dashed line in FIG. 5, before X-ray application (that is, in a case where radiation has not been applied), the electric current (on-state current) that flows when the transistor is in the on state is about $5 \times 10^{-8}$ A when the gate voltage is 5 V.

On the other hand, after X-ray application (that is, in a case where radiation has been applied), the on-state current increases and reaches about $8 \times 10^{-7}$ A as represented by a solid line in FIG. 5.

Therefore, when the rate of increase in the electric current that flows through a transistor is measured in this way, whether radiation is applied or not can be determined. Further, from the relationship between the rate of increase in the electric current that flows through a transistor and the radiation dose, the radiation dose that corresponds to the rate of increase in the electric current flowing through the transistor can be determined by performing calculation.

Alternatively, the fact that, in response to radiation, an electric current starts flowing through a transistor that has been turned off can be used.

In the example illustrated in FIG. 5, before X-ray application, the drain current remains approximately 0 A ($1 \times 10^{-12}$ A or less) when the gate voltage is −2 V as represented by the dashed line; however, in the case where an X-ray has been applied, the drain current of $1 \times 10^{-8}$ A flows as represented by the solid line. Accordingly, the presence or absence of radiation can be detected.

In the following embodiments, a case is described where the semiconductor described above constitutes the transistor (semiconductor element), the energy ray detector includes the transistors that are arranged in a grid pattern and that each have an active layer, and information regarding radiation is detected from changes in a property of the transistors, for example.

Note that, in the following embodiments, "semiconductor" means a portion that is formed of one type of impurity, such as an n-type impurity or a p-type impurity, and "semiconductor element" means an element, such as a transistor, a diode, or a capacitor, formed by combining semiconductors.

[First Embodiment]

One embodiment of the present invention is described below with reference to FIGS. 1(*a*) and 1(*b*) to FIG. 8.

<Overall Configuration of Energy Ray Detector 1>

First, an example of the overall configuration of an energy ray detector according to the this embodiment using a TFT as the transistor illustrated in FIG. 3 having the gate voltage-drain current property illustrated in FIG. 5 is described.

Figure 1:
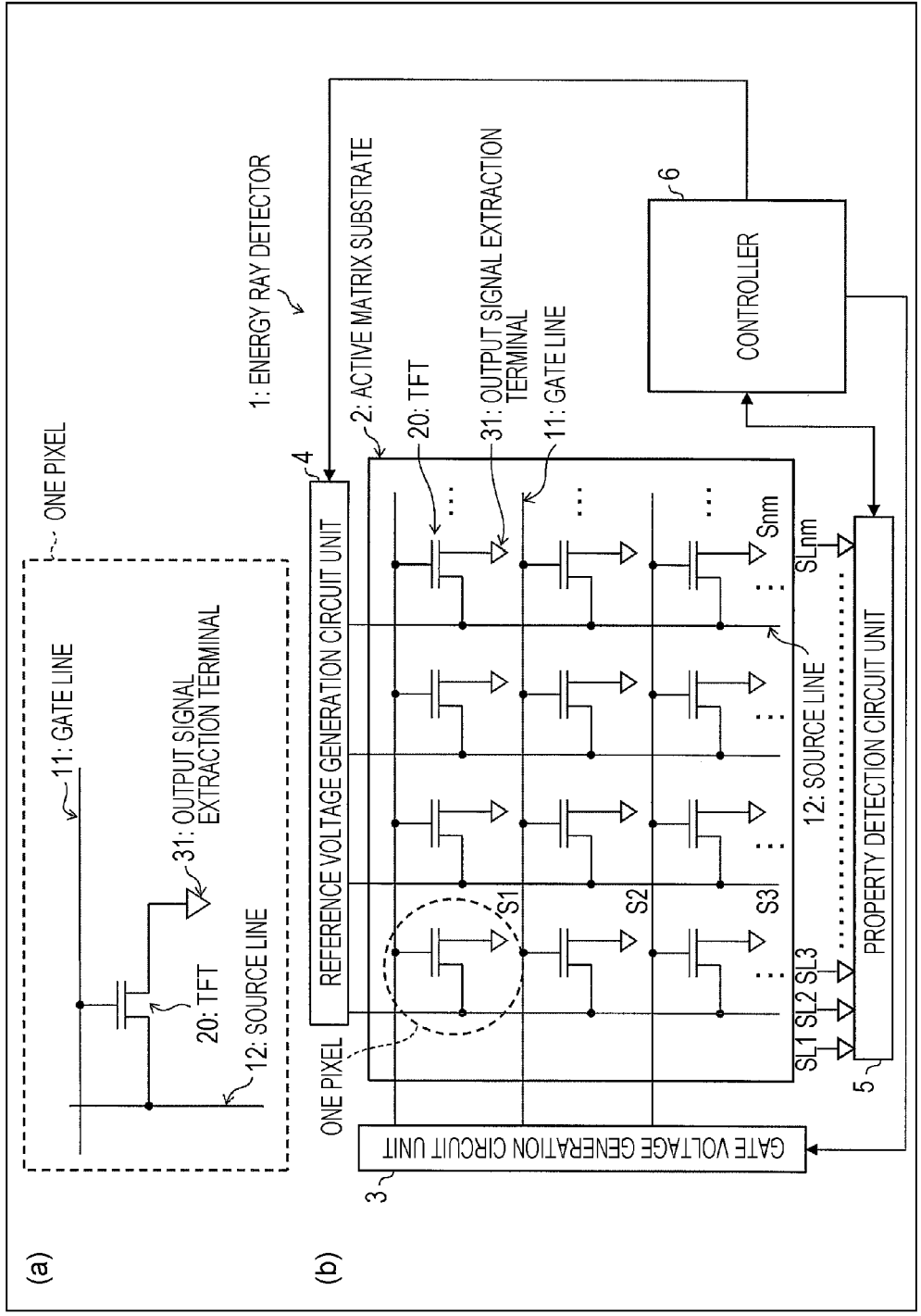
FIG. 1(a) is a circuit diagram illustrating a basic circuit configuration of one pixel in an energy ray detector according to a first embodiment.
FIG. 1(b) is a block diagram illustrating an example of the overall configuration of the energy ray detector according to the first embodiment.

FIG. 1(*a*) is a circuit diagram illustrating a basic circuit configuration of one pixel in an energy ray detector 1 according to this embodiment, and FIG. 1(*b*) is a block diagram illustrating an example of the overall configuration of the energy ray detector 1 according to this embodiment.

As illustrated in FIG. 1(*b*), the energy ray detector 1 according to this embodiment includes an active matrix substrate 2, a gate voltage generation circuit unit 3 and a reference voltage generation circuit unit 4 that function as a drive circuit, a property detection circuit unit 5, and a controller 6.

These constituent elements are described in detail below.

(Active Matrix Substrate 2)

The energy ray detector 1 according to this embodiment includes a plurality (n×m pieces) of pixels S1 to Snm (n and m each represent any integer equal to or larger than 1) arranged in a grid pattern on the active matrix substrate 2, as illustrated in FIG. 1(*b*). Hereinafter, the pixels S1 to Snm are generally referred to as pixels Sx. The active matrix substrate 2 is formed in a substantially square shape, for example.

As illustrated in FIG. 1(*b*), the pixels Sx each include electrode lines in an XY matrix constituted by one of a plurality (n lines) of gate lines 11 (scanning lines) and one of a plurality (m lines) of source lines 12 (sensor row selection lines), a TFT 20, and an output signal extraction terminal 31. The TFT 20 is a transistor having the gate voltage-drain current property illustrated in FIG. 5. The TFT 20 functions as a radiation detection element, and the active layer of the TFT 20 functions as a radiation detection layer. Therefore, the pixels Sx on the active matrix substrate 2 each function as a radiation detection unit. The configuration of the TFT 20, that is, the configuration of the transistor used in this embodiment, is described in detail below.

The gate lines 11 and the source lines 12 are mutually arranged in a grid pattern as illustrated in FIG. 1(*b*). The pixel Sx is disposed for each combination of the gate lines 11 and the source lines 12. Therefore, the TFTs 20 are arranged in a grid pattern on the active matrix substrate 2.

As illustrated in FIG. 1(*a*), the gate electrode G (see FIG. 3) of the TFT 20 in each pixel Sx is connected to the corresponding gate line 11 of the pixel Sx. One of the source electrode S (see FIG. 3) and the drain electrode D (see FIG. 3) of the TFT 20 in each pixel Sx is connected to the corresponding source line 12 of the pixel Sx. The other of the source electrode S and the drain electrode D of the TFT 20 in each pixel Sx is connected to the output signal extraction terminal 31, which is provided in each pixel Sx, and is consequently connected to one of signal lines SL1 to SLnm of the property detection circuit unit 5 via the output signal extraction terminal 31.

The gate lines 11 extend in a row direction (in the right-left direction in FIGS. 1(*a*) and 1(*b*)) and are connected to the output of the gate voltage generation circuit unit 3. The source lines 12 extend in a column direction (in the up-down direction in FIGS. 1(*a*) and 1(*b*)) and are connected to the output of the reference voltage generation circuit unit 4.

(Gate Voltage Generation Circuit Unit 3 and Reference Voltage Generation Circuit Unit 4)

The gate voltage generation circuit unit 3 is provided on one side in the extension direction of the gate lines 11, for example. The reference voltage generation circuit unit 4 is provided on one side in the extension direction of the source lines 12, for example.

The gate voltage generation circuit unit 3 is a circuit that applies a gate voltage of the TFTs 20 and applies the gate voltage for operating the TFTs 20 of the pixels Sx to the gate lines 11. The gate voltage generation circuit unit 3 applies a voltage for turning the TFTs 20 on or off to thereby switch the TFTs 20 between on and off. The gate voltage generation circuit unit 3 controls the timing at which the gate voltage is applied in accordance with a control signal from the controller 6.

The reference voltage generation circuit unit 4 applies a constant voltage (the source voltage applied when the property illustrated in FIG. 5 has been measured) to the source lines 12 as a reference voltage.

Among the pixels Sx, in the pixel Sx in which the reference voltage is applied to the source line 12 and the voltage for turning on the TFT 20 is applied to the gate line 11, an electric current flows into the output signal extraction terminal 31. Accordingly, it is possible to make an electric current flow only in a certain pixel Sx, and therefore, the electric currents flowing through the TFTs 20 can be measured for all of the pixels Sx at once or the electric current flowing through the TFT 20 can be measured only for a certain pixel Sx.

(Property Detection Circuit Unit 5)

The property detection circuit unit 5 according to this embodiment is a drain current detection circuit unit and detects the electric currents (drain currents) that flow through the TFTs 20 as a property of the TFTs 20.

Figure 6:
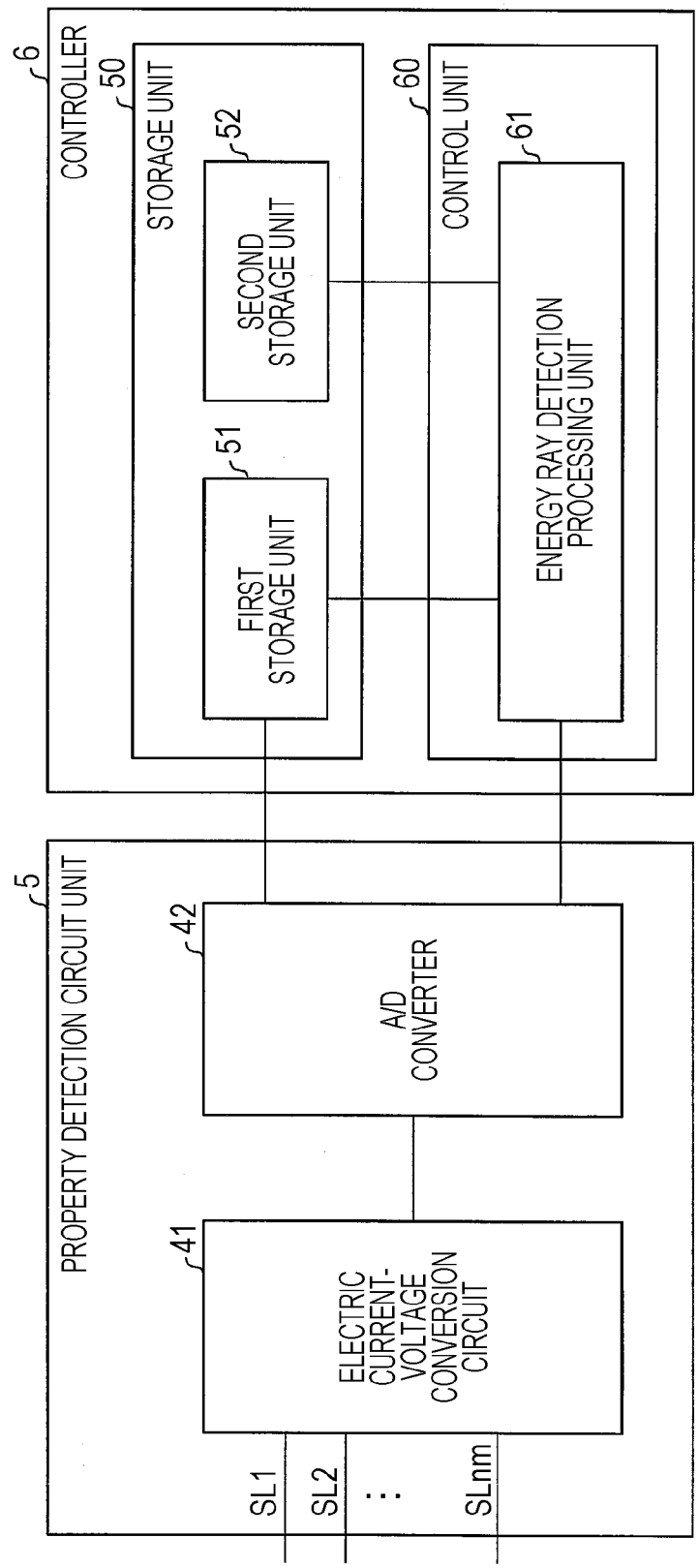
FIG. 6 is a block diagram illustrating an overall configuration of a property detection circuit unit and a controller in the energy ray detector according to the first embodiment.

FIG. 6 is a block diagram illustrating an overall configuration of the property detection circuit unit 5 and the controller 6.

The property detection circuit unit 5 according to this embodiment includes the signal lines SL1 to SLnm, an electric current-voltage conversion circuit 41 that converts the drain current into a voltage signal, and an A/D converter 42 (analog-to-digital converter) that converts an analog signal into a digital signal, as illustrated in FIG. 6.

The output signal extraction terminals 31 connected to the respective TFTs 20 are connected to the electric current-voltage conversion circuit 41 via the signal lines SL1 to SLnm connected to the electric current-voltage conversion circuit 41. The A/D converter 42 is connected to the output side of the electric current-voltage conversion circuit 41.

Note that a level adjuster (not illustrated) that adjusts the amplitude level of a voltage signal output from the electric current-voltage conversion circuit 41 to a level for which conversion by the A/D converter 42 is possible may be provided to the output side of the electric current-voltage conversion circuit 41, and the electric current-voltage conversion circuit 41 may be connected to the A/D converter 42 via the level adjuster.

The electric currents that flow through the TFTs 20 are input into the electric current-voltage conversion circuit 41 and are converted into voltages by the electric current-voltage conversion circuit 41. Thereafter, the voltages are converted into digital signals by the A/D converter 42, and the digital signals are sent to the controller 6.

(Controller 6)

The property detection circuit unit 5 and the controller 6 function as a detection unit that detects changes in an electrical property of the TFTs 20, which is an electrical property of the semiconductors, to thereby detect information regarding radiation applied to the semiconductors.

The controller 6 according to this embodiment includes a storage unit 50 and a control unit 60 as illustrated in FIG. 6. First, the storage unit 50 is described.

The storage unit 50 includes a first storage unit 51 and a second storage unit 52 as illustrated in FIG. 6.

The first storage unit 51 stores digital values generated by the property detection circuit unit 5 on the basis of the electric currents that flow through the TFTs 20 of the pixels Sx from the reference voltage generation circuit unit 4 in a state where no radiation is present.

The second storage unit 52 stores a relationship between the amount of change in an electrical property of the TFT 20 and the amount of energy ray radiation measured in advance.

The second storage unit 52 may store a mathematical relation for calculating, from an amount of change in an electrical property of the TFT 20, the amount of energy ray radiation corresponding to the amount of change or may store (save) an LUT (look up table or conversion table) for deriving, from an amount of change in an electrical property of the TFT 20, the amount of energy ray radiation corresponding to the amount of change, for example.

As the first storage unit 51, a rewritable non-volatile memory, such as a flash memory, is used, for example. As the second storage unit 52, an EEPROM (registered trademark), which is a semiconductor memory and in which data is kept retained even after the power is turned off, is used, for example.

Next, the control unit 60 is described.

The control unit 60 includes processors, such as a microprocessor and a DSP (digital signal processor).

The control unit 60 includes a timing control unit that outputs control signals to the reference voltage generation circuit unit 4 and to the gate voltage generation circuit unit 3, and is capable of controlling, with the control signals, the timing at which the electric current is measured for each of the plurality of TFTs 20 arranged in rows and columns during a predetermined operation, as described above in the section of the active matrix substrate 2. An example of performing this timing control is described below, and energy ray detection by the control unit 60 is described first.

The control unit 60 includes an energy ray detection processing unit 61 that calculates the amount of energy ray radiation from the voltage value of the TFT 20 which is converted into a digital signal by the property detection circuit unit 5.

The energy ray detection processing unit 61 performs amount-of-change calculation and radiation dose calculation.

In the amount-of-change calculation, the amount of change in an electrical property occurring in each TFT 20 in accordance with the radiation dose is calculated.

The value of the electric current that flows through the TFT 20 of each pixel Sx after application of radiation is processed by the property detection circuit unit 5, and is thereafter compared, by the energy ray detection processing unit 61, with a value stored in the first storage unit 51.

When radiation is applied to the TFT 20, the electric current that flows through the TFT 20 to which radiation is applied increases. Therefore, in the amount-of-change calculation, the value of the increasing electric current is compared with the value of the electric current that flows through the TFT 20 of the pixel Sx in the state where no radiation is present, this value being stored in the first storage unit 51, to thereby detect the amount of change in an electrical property of the TFT 20 due to the radiation.

In the radiation dose calculation, the relationship between the amount of change in an electrical property of the TFT 20 and the amount of energy ray radiation stored in the second storage unit 52 is compared with the amount of change in an electrical property of each TFT 20 calculated in the amount-of-change calculation to thereby detect the radiation dose (amount of energy ray radiation) corresponding to the amount of change in an electrical property of each TFT 20 calculated in the amount-of-change calculation.

Note that the detection may be performed by calculation using a mathematical relation or by using an LUT. In a case where an LUT is stored in the second storage unit 52, for an amount of change in a property that is not included in the LUT, the amount of energy ray radiation may be determined by performing interpolation calculation from an amount of energy ray radiation obtained from the LUT. An amount of change in a property within a certain range may be associated with an amount of energy ray radiation within a certain range.

(Method for Detecting Distribution of Radiation Dose)

A method for detecting the distribution of the radiation dose is described below as an example application of this embodiment.

In a case of measuring the electric currents that flow through the TFTs 20 in the respective pixels Sx illustrated in FIG. 1(b), the electric currents flowing through the TFTs 20 can be simultaneously measured for all of the pixels Sx or the electric currents can be measured sequentially in a time-division manner.

In a case of measuring the electric currents that flow through the TFTs 20 simultaneously for all of the pixels Sx, the reference voltage generation circuit unit 4 and the gate voltage generation circuit unit 3 are controlled in accordance with control signals from the control unit 60 to thereby apply a reference voltage to all of the source lines 12 and a voltage for turning on the transistors to all of the gate lines 11. By performing this control, the electric currents that flow through all of the pixels Sx can be measured. Accordingly, by measuring increases in the electric current values before and after application of radiation as described above, the amounts of radiation applied to all of the pixels Sx can be measured. Note that the output signal extraction terminals 31 of the TFTs 20 of the respective pixels Sx are connected to the property detection circuit unit 5 separately from one another, and therefore, the radiation dose can be detected for each pixel Sx.

Next, as the case of sequentially measuring the electric currents that flow through the TFTs 20 in a time-division manner for all of the pixels Sx, a case of sequential measurement on the pixels Sx one by one, for example, is described.

In a case of measuring the electric current that flows through the TFT 20 of the pixel S1 illustrated in FIG. 1(b), the reference voltage generation circuit unit 4 and the gate voltage generation circuit unit 3 are controlled in accordance with control signals from the control unit 60 to thereby apply a reference voltage only to the source line 12 connected to the pixel S1 and a voltage for turning on the transistor only to the gate line 11 connected to the pixel S1. By performing this control, only the electric current that flows through the pixel S1 can be measured. Accordingly, by measuring an increase in the electric current value before and after application of radiation as described above, the amount of radiation applied to the pixel S1 can be measured. By measuring the amounts of radiation applied to all of the pixels Sx up to the pixel Snm in a similar manner, the distribution of radiation applied to the active matrix substrate 2 can be detected.

By measuring such a two-dimensional distribution of the radiation dose (energy distribution), the values of the amounts of radiation applied to the pixels Sx, which are sources used to reconstruct, in image processing, a radiograph that passes through an object, can be obtained. The obtained values of the radiation doses can be displayed on a display panel, such as a display monitor, so as to be visible.

Note that, in FIG. 1(b), the output signal extraction terminals 31 of the pixels Sx are configured so as to be connected to the signal lines SL1 to SLnm of the property detection circuit unit 5 separately from one another. However, in the case of separately performing sequential measurement on the pixels Sx, the output signal extraction terminals 31 need not be individually provided for the respective pixels Sx. The pixel Sx for which the electric current is measured can be known from a signal from the control unit 60. Therefore, even if only one output signal extraction terminal 31 is provided for the pixels Sx, and the output signal extraction terminal 31 is connected to the property detection circuit unit 5, electric currents can be measured.

However, in a case where the energy ray detector 1 is created while setting the pixel size to 50 µm, for example, if only a resolution of 200 µm is required in an application, the cell of 50 µum can be handled as a subpixel, and an aggregation of four subpixels can be handled as one pixel. If a control signal is configured so as to select two source lines and two gate lines and to turn on the transistors, four subpixels can be handled as one pixel.

In other words, although an electrical property of the TFT 20 provided in each pixel Sx is detected in this embodiment, this detection need not be performed for each pixel Sx and may be performed for each unit area set in advance. In this case, the unit area may include one pixel or may include a plurality of pixels. In this case, the output signal extraction terminals 31 of the respective pixels Sx need to be connected to the property detection circuit unit 5 separately from one another.

As described above, except for the case of separately performing sequential measurement on the pixels Sx, the output signal extraction terminals 31 need to be connected to the property detection circuit unit 5 separately from one another. Therefore, in this embodiment, the description is given with reference to the diagram in which the output signal extraction terminals 31 are connected to the property detection circuit unit 5 separately from one another, as illustrated in FIG. 1(b).

(Configuration of Transistor)

Now, the configuration of the transistor used in this embodiment is described.

In this embodiment, the active layer of the transistor, which constitutes a radiation detection layer, may be any type of semiconductor as long as a certain correlation between an electrical property of the transistor and the amount of energy ray radiation is obtained from the semiconductor. Among others, a preferable semiconductor is a semiconductor with which an electrical property of the transistor linearly changes relative to the radiation dose or the electrical property linearly changes relative to the amount of energy ray radiation.

When an electrical property of the transistor has a certain correlation with the amount of energy ray radiation, the amount of energy ray radiation can be obtained from the amount of change in an electrical property of the transistor. However, when an electrical property of the transistor linearly changes relative to the amount of energy ray radiation, the amount of energy ray radiation can be easily detected.

Accordingly, a semiconductor that constitutes the active layer of the transistor according to this embodiment is preferably made of a material with which electrical properties (for example, the threshold voltage, on-state current, and off-state current) of the transistor linearly change in response to application of radiation. An oxide semiconductor, with which electrical properties (for example, the threshold voltage, on-state current, and off-state current) of the transistor linearly change in response to application of radiation, is more preferable.

As described above, electrical properties of the transistor having an active layer formed of an oxide semiconductor significantly change relative to the amount of applied energy ray radiation.

For example, the band gap of an oxide semiconductor is 2.8 to 3.3 eV if the oxide semiconductor is an In—Zn—Ga—O-based oxide. In a case where the photon energy is within a range approximately several times the band gap energy, that is, in a case of visible light, ultraviolet light, or the like, the energy changes to thermal energy or the like and is lost after electron-positive hole pairs have been produced.

However, when radiation having energy thousands times to tens of thousands times higher than the band gap energy is applied to the active layer, optically induced carriers (electron-positive hole pairs) are serially produced within the transistor having an active layer formed of a semiconductor, an oxide semiconductor, or the like.

An oxide semiconductor has an extremely small leakage current, and therefore, the amount of radiation that has been once applied can be retained in the transistor as information for a long time without external application of a voltage for retaining data. As a result, the energy ray detector 1 using an oxide semiconductor can be preferably used for monitoring purposes in particular, for example.

Therefore, an oxide semiconductor is preferable as a semiconductor that constitutes the active layer of the transistor. Examples of the preferable semiconductor material include an oxide semiconductor having an amorphous oxide containing at least one of an In—Zn—Ga—O-based oxide, an In—Zn—Ga—Mg—O-based oxide, an In—Zn—O-based oxide, an In—Sn-based oxide, an In—O-based oxide, an In—Ga—O-based oxide, and an Sn—In—Zn—O-based oxide, for example.

However, a semiconductor used for the active layer of the transistor in this embodiment is not limited to an oxide semiconductor and may be made of any material having the conductivity of semiconductors. Preferable examples of a material used for the semiconductor other than an oxide semiconductor include Si, Ga, GaAs, GaN, GaP, SiC, graphene, and molybdenum sulfide.

The crystal structure of the semiconductor used in this embodiment including an oxide semiconductor is not limited to a non-monocrystalline structure and may be a monocrystalline structure. In a case of a non-monocrystalline structure, the structure may be an amorphous structure or a polycrystalline structure. Alternatively, the structure may be a structure including an amorphous material that is partially crystalline or may be an amorphous structure. An organic semiconductor material may be used regardless of whether the material is of a low-molecular type or a high-molecular type.

The electron carrier concentration of the amorphous oxide is preferably $10^{18}/cm^3$ (that is, $1 \times 10^{18}/cm^3$) or less, although the concentration changes in accordance with the oxygen concentration or the like of the oxide semiconductor layer. The amorphous oxide may be at least partially made of an amorphous oxide.

The conductivity type of the transistor according to this embodiment is not limited, and the conductivity type may be the n-type described above, the p-type, or the i-type that uses an intrinsic layer.

It is preferable that a material for the gate electrode contain at least one of TaN, TaC, TiN, TiCN, TiAlN, W, and WNMo. However, a material for the gate electrode of the transistor according to this embodiment needs to be such that the work function of the gate electrode satisfies a desired property, and is not limited to that described above.

Note that, in a case where the active layer of the above-described transistor is an oxide semiconductor having an amorphous oxide, it is preferable that at least one of the gate electrode G, the source electrode S, and the drain electrode D be made of an oxide.

It is preferable that the active layer of the transistor be made by using a sputtering method; however, the manufacturing process is not limited to this method.

In this embodiment, radiation is detected by using changes in a property of the transistors provided on the surface of the active matrix substrate 2 as described above, and radiation can be detected well even if the film thickness of the active layers of the transistors is 1 μm or less, for example.

(Preferable Example of Transistor)

Now, a preferable configuration of the transistor used in this embodiment is described.

As the transistor used in this embodiment, that is, as the transistor illustrated in FIG. 1(a) or 1(b), a general MOS (metal oxide semiconductor) transistor may be used. However, properties of this type of transistor significantly change in response to radiation. Therefore, it is preferable to use the TFT 20 having a structure as illustrated in FIG. 7.

Figure 7:
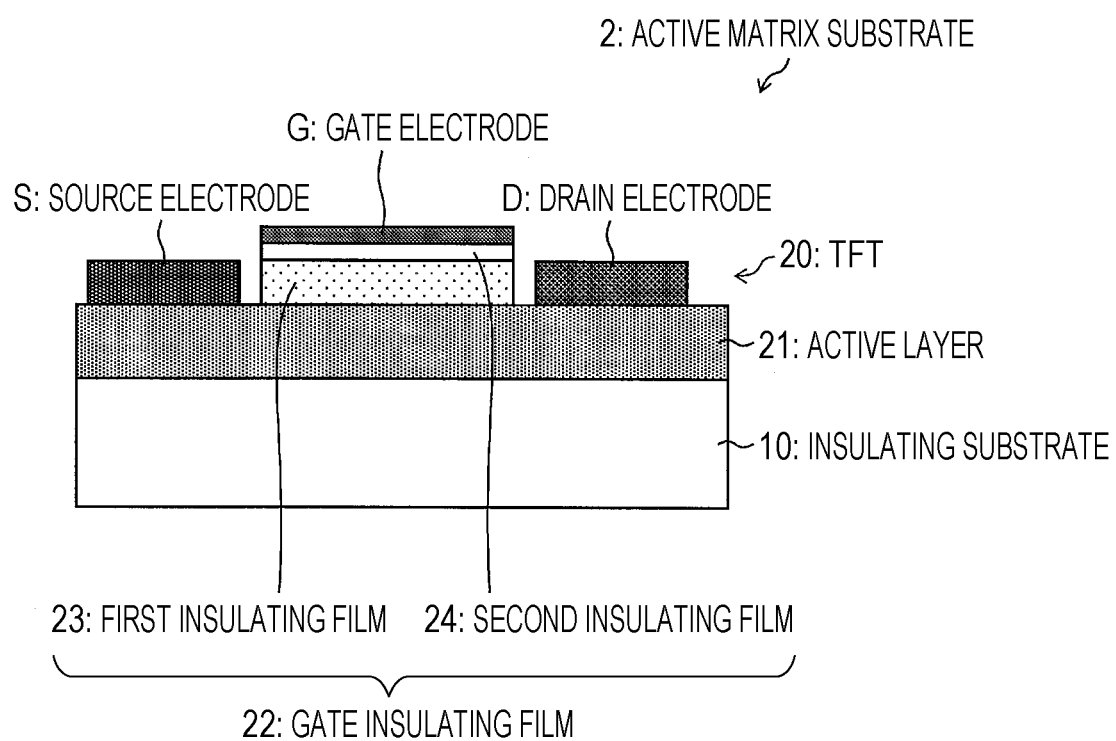
FIG. 7 is a cross-sectional view illustrating an overall configuration of a principal part of the energy ray detector according to the first embodiment.

FIG. 7 is a cross-sectional view illustrating an overall configuration of a principal part of the energy ray detector 1 according to this embodiment. FIG. 7 illustrates an example of a preferable configuration of the TFT 20 on the active matrix substrate 2 according to this embodiment.

The TFT 20 has a structure in which the source electrode S and the drain electrode D are provided on an active layer 21 that is provided on an insulating substrate 10, which is a glass substrate or the like, and the gate electrode G is provided between the source electrode S and the drain electrode D on the active layer 21 with a gate insulating film 22 interposed therebetween, as illustrated in FIG. 7.

The gate insulating film 22 preferably contains silicon and oxygen. The gate insulating film 22 preferably contains silicon and nitrogen.

In this embodiment, an oxide semiconductor is used for the active layer 21 as a semiconductor, and the gate insulating film 22 has a layered structure including a first insulating film 23 that contains nitrogen and silicon and a second insulating film 24 that contains oxygen and silicon.

As described above, when radiation having energy thousands times to tens of thousands times higher than the band gap energy of an oxide semiconductor is applied to the active layer 21, optically induced carriers are serially produced within the TFT 20 having the active layer 21 formed of a semiconductor, an oxide semiconductor, or the like.

When the gate insulating film 22 is configured to have a layered structure constituted by the first insulating film 23 and the second insulating film 24, the first insulating film 23 contains nitrogen and silicon, and the second insulating film 24 contains oxygen and silicon, it is possible to efficiently trap positive holes induced by the electric field of the gate insulating film 22 among the optically induced carriers that are serially produced.

The gate insulating film 22 may be configured to have a layered structure constituted by the first insulating film 23 that contains nitrogen, oxygen, and silicon and the second insulating film 24 that contains nitrogen, oxygen, and silicon. In this case, it is preferable that the first insulating film 23 contain more nitrogen than oxygen and that the second insulating film 24 contain more oxygen than nitrogen.

Note that the first insulating film 23 is not limited to a film that contains nitrogen, oxygen, and silicon, may be another type of insulating film as long as the insulating film has a capability to capture electrons or positive holes, and may be configured as a layered film constituted by a plurality of films, such as a high-dielectric film made of HfAlO and so on, a silicon nitride film, an HfAlO film, and an alumina film.

In the case where the gate insulating film 22 is configured to have a layered structure constituted by the first insulating film 23 and the second insulating film 24, it is preferable that the first insulating film 23 have a film thickness thicker than that of the second insulating film 24.

One of the reasons for this thickness is that, by making the film thickness of the first insulating film 23 thicker than that of the second insulating film 24, the total number of captured carriers is ensured. Another reason is that, if the film thickness of the first insulating film 23 is thinner than that of the second insulating film 24, it is difficult to sufficiently satisfy the specifications for reliability, such as dielectric breakdown resistance, coatability, and so on required for the gate insulating film 22.

However, the configuration of the gate insulating film 22 is not limited to the above-described configuration, and the film thickness of the first insulating film 23 may be thinner than that of the second insulating film 24. As a measure taken to make the film thickness of the first insulating film 23 thinner, the first insulating film 23 may be oxidized and the oxide film may be formed on the first insulating film 23, for example. When the oxide film is formed on the first insulating film 23, the number of captured carriers on the interface between the oxide film and the first insulating film 23 increases, pin holes present on the first insulating film 23 are plugged, and increased reliability is expected accordingly.

The amount of change in the threshold voltage of the transistor changes in accordance with the carrier concentration of the semiconductor and the oxide semiconductor as well as the type, film property, and structure of the gate insulating film 22, and therefore, it is possible to perform control so as to attain an optimum amount of change in the threshold voltage on the basis of the process and device structure.

For example, in a case where an SiNx film is used for the first insulating film 23, it is preferable that the mole ratio x of N to Si be set to a value within the range of $0.67<x<1.33$, and the film thickness Tct1 of the first insulating film 23 be set to a value within the range of $10 \text{ nm}<\text{Tct1}<990 \text{ nm}$. However, in this embodiment, the values are not limited to the above-described values.

The stoichiometric composition of the SiNx film is $Si_3N_4$. In this case, the mole ratio x of N to Si satisfies $x=1.33$. An SiNx film satisfying $x<1.33$ has an Si-rich composition in which Si has a larger composition ratio. Therefore, it is considered that carrier traps are produced due to dangling bonds of Si atoms.

The concentration of carrier traps tends to increase as the mole ratio x of N to Si drops below 1.33. A composition in a case of $x=0.67$ corresponds to a composition where two bonds among the four bonds of an Si atom are dangling bonds or form covalent bonds with an adjacent Si atom on average. Therefore, a large number of covalent bonds are present, the insulation property of the SiNx film deteriorates, and the gate leakage current significantly increases.

Therefore, it is desirable that the mole ratio x of N to Si satisfy $0.67<x$; however, the mole ratio is not limited to this value. For example, in a case where an SiOxNy film is used for the first insulating film 23, the mole ratio x of N to the sum of Si, O, and N is represented by $N/(Si+N+O)$. The value of $N/(Si+N+O)$ is 0 at the minimum and 0.35 at the maximum. Therefore, it is desirable that the mole ratio x of N to the sum of Si, O, and N satisfy $0.35<x$; however, the mole ratio is not limited to this value.

In the above-described TFT 20, it is preferable that the film thickness Tox of the gate insulating film 22 (that is, the sum of the film thickness of the first insulating film 23 and that of the second insulating film 24) be 1 μm or less.

The amount of change in electrical properties of a transistor is in proportion to the thickness of the insulating film and tends to increase as the insulating film becomes thicker. However, in general, the source voltage (VDD) of a transistor is designed so that the electric field Fcx of the gate insulating film of the transistor in the on state satisfies 5 to 6 MV/cm. Accordingly, it is desirable that the film thickness Tox of the gate insulating film 22 in the above-described TFT 20 be 1 μm or less.

In a case where an SiOx film is used for the second insulating film 24, the mole ratio of oxygen to silicon in the silicon oxide is assumed to be between 0 and 2. Therefore, it is preferable that the mole ratio x of O to Si be set to a value within the range of $1 \leq x \leq 2$, and the film thickness Tct2 of the second insulating film 24 be set to a value within the range of $10 \text{ nm}<\text{Tct2}<990 \text{ nm}$. However, the values are not limited to these values in this embodiment.

In the description given above, the case is described where the gate insulating film 22 is configured to have a layered structure including the first insulating film 23 and the second insulating film 24, for example. However, the transistor according to this embodiment is not limited to the transistor having the structure including the first insulating film 23 and the second insulating film 24 as illustrated in FIG. 7.

Note that radiation having extremely high energy is likely to pass through the active layer 21, and therefore, it is preferable that the insulating substrate 10 be formed of an insulating material having excellent radiation resistance.

<Effects>

The energy ray detector 1 according to this embodiment detects radiation by detecting the amounts of change in electrical properties caused by optically induced carriers (electron-positive hole pairs) produced in the active layers 21 of the TFTs 20 formed of semiconductors in response to radiation (energy ray radiation) applied to the active matrix substrate 2, as described above. Therefore, in the energy ray detector 1 according to this embodiment, it is not necessary to make the film thickness of the semiconductors thicker unlike the case described in PTL 1 and PTL 2 where electric charges generated within the semiconductor film in response to application of radiation to the semiconductor film are stored in the charge storage capacitors and the stored electric charges are extracted to detect the radiation, and the semiconductors can be made thinner and the entire device can be made thinner consequently.

That is, the energy ray detector 1 detects radiation by using changes in properties of the transistors provided on the surface of the active matrix substrate 2 as described above, and radiation can be detected well even if the film thickness of the active layers of the transistors is 1 μm or less, for example. Therefore, a thick film for radiation transformation used in conventional semiconductor detection devices is not necessary.

Since the semiconductors can be made thinner as described above, the problem does not arise in which a large internal stress is accumulated in the vicinity of the boundary between the area in which the semiconductor layer is formed and the area in which the semiconductor layer is not formed due to the difference in the amount of hardening shrinkage in the thickness, which may result in the lack of reliability, such as warps and lower impact-resistance. Therefore, according to this embodiment, the energy ray detector 1 that is highly reliable can be provided.

In the case where electric charges generated within the semiconductor film in response to application of energy ray radiation to the semiconductor film are stored in the charge storage capacitors and the stored electric charges are extracted to thereby detect the energy ray radiation as in the related art, it is not possible to read information before energy ray radiation is applied for a long time and the charge storage capacitors are sufficiently charged.

However, the energy ray detector 1 according to this embodiment does not require such a charge time, and therefore, enables high-speed reading of information. Further, the sensitivity to radiation (S/N ratio) is high, and therefore, the radiation application time can be shorter and the radiation exposure can be reduced.

According to this embodiment, the threshold voltages of transistors located in the pixels Sx (unit area) to which a large amount of radiation is applied transition to a large degree, those of transistors located in the pixels Sx (unit area) in which the radiation dose is small transition to a small degree, and the amounts of transition linearly change in accordance with the amount of applied radiation. Therefore, it is possible to detect the radiation dose in a wide area with certainty from a very small radiation dose.

The energy ray detector 1 according to this embodiment does not require a pair of radiation field-effect transistors and loads connected to the respective transistors in order to detect radiation unlike PTL 3. In the energy ray detector 1 according to this embodiment, the TFTs 20 arranged in a grid pattern respectively function as energy ray detection elements (energy detection elements). Therefore, according to this embodiment, the energy ray detector 1 that is small and lightweight and have the TFTs 20, which are radiation detection elements (energy detection elements), arranged in a grid pattern can be provided.

For the transistor used in this embodiment, a non-irradiation period is provided after application of radiation, and therefore, the threshold voltage that has transitioned (that has transitioned in the negative direction as described above in a case of an n-type transistor, for example) is restored to the original state. Therefore, by providing a non-irradiation period after application of radiation, the energy ray detector 1 according to this embodiment can be repeatedly used in radiation detection.

Further, according to this embodiment, transistors used for amplifiers, switches, level shifters, buffers, and other peripheral circuits can be formed at once in the same process as that for the transistors used in this embodiment. By forming a plurality of transistors in the same process in this way, it is possible to suppress an increase in the number of processes.

<Diode>

Figure 8:
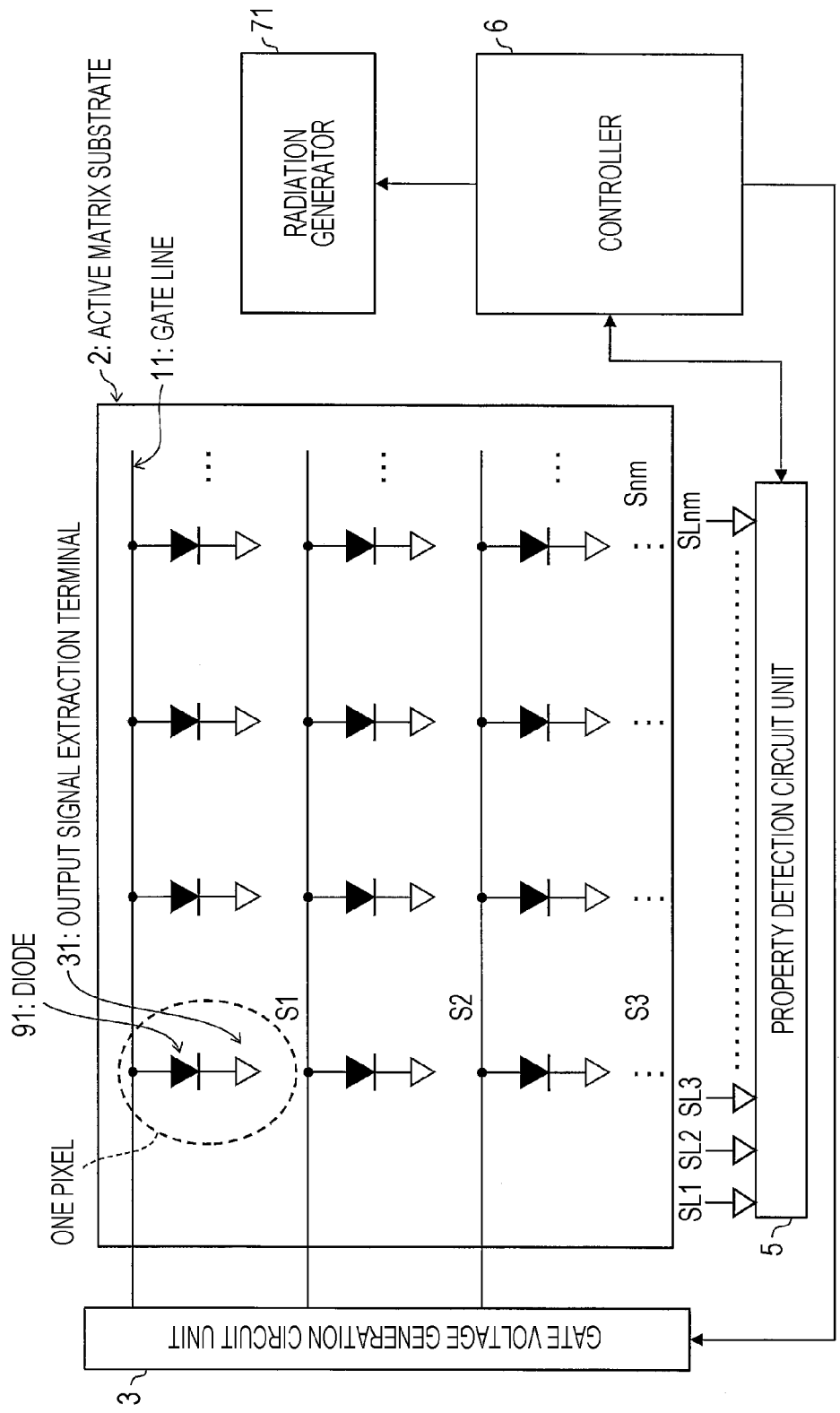
FIG. 8 is a block diagram illustrating an example of the overall configuration of the energy ray detector using diodes as semiconductor elements in the first embodiment.

FIG. 8 is a block diagram illustrating an example of the overall configuration of the energy ray detector 1 using diodes as the semiconductor elements.

The energy ray detector 1 illustrated in FIG. 8 includes diodes 91 as the semiconductor elements. As illustrated in the figure, the semiconductor elements in this embodiment can be constituted by diode elements other than transistors.

Examples of the diode (for example, the diode 91) include a PN diode, a Schottky diode, a PIN diode, an MIM (Metal-Insulator-Metal) diode, and an MIS (Metal-Insulator-Semiconductor) diode. The diode may be a diode-connected TFT configured by connecting one of the conducting terminals of the TFT 20 to the gate electrode G to form a diode connection.

[Second Embodiment]

Another embodiment of the present invention is described below with reference to FIGS. 9(a) and 9(b). In this embodiment, differences from the first embodiment are described. Constituent elements having the same functions as the constituent elements used in the first embodiment are given the same reference numerals, and description thereof is omitted.

Also in this embodiment, the basic idea and the principle of energy ray detection in terms of the overview of the invention are the same as in the first embodiment.

In the first embodiment, the case is described, for example, where the radiation dose is detected from the electric current that increases when the TFT 20 of each pixel Sx is turned on. In this embodiment, a case is described, for example, where the radiation dose is detected from the electric current that increases when the TFT 20 that has been turned off transitions to the on state in accordance with a change in the threshold in response to application of radiation.

<Overall Configuration of Energy Ray Detector 1 and Method for Detecting Radiation>

Figure 9:
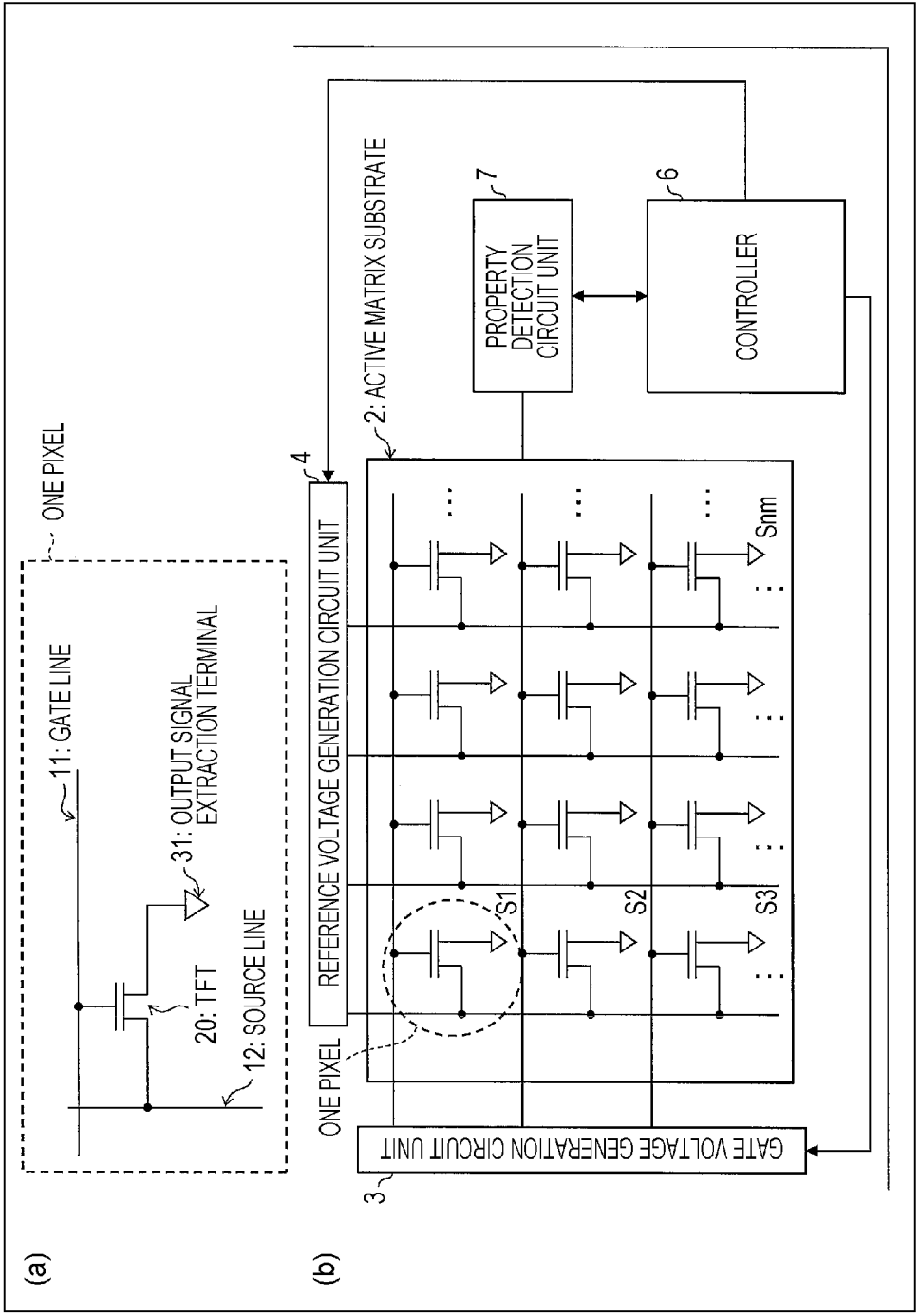
FIG. 9(a) is a circuit diagram illustrating a basic circuit configuration of one pixel in the energy ray detector according to a second embodiment.
FIG. 9(b) is a block diagram illustrating an example of the overall configuration of the energy ray detector according to the second embodiment.

FIG. 9(a) is a circuit diagram illustrating a basic circuit configuration of one pixel in the energy ray detector 1 according to this embodiment, and FIG. 9(b) is a block diagram illustrating an example of the overall configuration of the energy ray detector 1 according to this embodiment.

A method for detecting radiation performed by the energy ray detector 1 according to this embodiment is described below together with the functions of the controller 60 and the configuration of the storage unit 50.

First, the reference voltage generation circuit unit 4 applies a constant voltage (the source voltage applied when the property illustrated in FIG. 5 has been measured) to the source lines 12 as a reference voltage, and the gate voltage generation circuit unit 3 applies a voltage of −2 V to the gate lines 11.

In this embodiment, as illustrated in FIG. 9(a), the output signal extraction terminal 31 is grounded to a common electrode (not illustrated) of the active matrix substrate 2. In this embodiment, the electric current that flows from the reference voltage generation circuit unit 4 to the common electrode of the active matrix substrate 2 via the TFTs 20 of the respective pixels Sx is detected by a property detection circuit unit 7. This detection can be performed by providing the electric current-voltage conversion circuit 41, which is in the property detection circuit unit 5, between a power source that supplies the reference voltage and the reference voltage generation circuit unit 4.

As described in the first embodiment, when radiation is applied to the active matrix substrate 2, the amount of electric current that flows through the TFT 20 of each pixel Sx increases.

Also in this embodiment, by determining the radiation dose corresponding to the increased amount of electric current, the amount of applied radiation can be detected.

In this embodiment, however, the sum of the electric currents ($I_{off}$) that flow from the reference voltage generation circuit unit 4 to the common electrode of the active matrix substrate 2 via the TFTs 20 of the respective pixels Sx is measured first in a state where no radiation is present before application of radiation, and the measured value is stored in the first storage unit 51.

Note that in a state where no radiation is present or the radiation dose is small, the transistor of each pixel Sx is turned off, and therefore, the amount of drain current at this time has a small value close to 0 A.

Next, the sum of the electric currents ($I_{sum}$) that flow from the reference voltage generation circuit unit 4 to the common electrode via the TFTs 20 of the respective pixels Sx after application of radiation is measured, and the measured value is sent to the energy ray detection processing unit 61. The energy ray detection processing unit 61 compares $I_{sum}$ with $I_{off}$ stored in the first storage unit 51 to thereby detect the increased amount of electric current.

When radiation is applied, the drain current of $1 \times 10^{-8}$ A flows through the transistor of each pixel Sx, as described with reference to FIG. 5. Therefore, the sum of the electric currents ($I_{sum}$) that flow from the reference voltage generation circuit unit 4 to the common electrode via the transistors of the respective pixels Sx is $1 \times 10^{-8} \times (n \times m)$ A.

Accordingly, when the energy ray detection processing unit 61 determines the radiation dose corresponding to the increased amount of electric current, the amount of applied radiation can be detected.

In this case, the second storage unit 52 needs to store a relationship between the amount of change ($I_{sum} - I_{off}$) in the electric current that flows through the metal layer of the active matrix substrate 2 and the amount of energy ray radiation as a relationship between the amount of change in an electrical property of the TFT 20 and the amount of energy ray radiation.

However, in this embodiment, in the state where no radiation is present or the radiation dose is small, the transistor of each pixel Sx is turned off, and therefore, the amount of drain current at this time has a small value close to 0 A, as described above.

Therefore, according to this embodiment, the radiation dose of a certain level or more can be detected only by measuring $I_{sum}$.

In this case, the second storage unit 52 needs to store a relationship between the electric current ($I_{sum}$) that flows into the common electrode after application of radiation and the amount of energy ray radiation as a relationship between the amount of change in an electrical property of the TFT 20 and the amount of energy ray radiation. Note that, by taking into consideration the difference from $I_{off}$, a relationship between $I_{sum}$ and the amount of energy ray radiation corresponding to ($I_{sum}-I_{off}$) may be stored in advance.

In doing so, when a radiation dose detection unit in the energy ray detection processing unit 61 determines the radiation dose from $I_{sum}$, the amount of applied radiation can be detected. In this case, the first storage unit 51 can be omitted, and therefore, the number of components can be reduced. Further, $I_{sum}$ is used as the amount of change, and therefore, ($I_{sum}-I_{off}$) need not be calculated, resulting in a simplified analysis process. In other words, in this case, the property detection circuit unit 7 functions as an amount-of-change detection unit. Therefore, the energy ray detection processing unit 61 need not function as an analysis unit, and the amount-of-change calculation can be omitted.

In a case of detecting the presence or absence of radiation instead of the radiation dose, the energy ray detection processing unit 61 takes into consideration the difference between $I_{sum}$ and $I_{off}$ and determines that radiation is applied in a case where ($I_{sum}-I_{off}$) or $I_{sum}$ exceeds a threshold determined in advance from a relationship between ($I_{sum}-I_{off}$) or $I_{sum}$ and the radiation dose corresponding to ($I_{sum}-I_{off}$) or $I_{sum}$, to thereby determine that radiation is detected.

In a case where the value of ($I_{sum}-I_{off}$) or $I_{sum}$ is preliminarily small, the voltage of the reference voltage generation circuit unit 4 may be increased, and the voltage of the gate voltage generation circuit unit 3 may be reviewed to thereby increase the value of ($I_{sum}-I_{off}$) or $I_{sum}$.

In a case where properties of the transistor that constitutes the pixel Sx are changed, measurement similar to that in FIG. 5 needs to be performed to thereby determine the source voltage and the gate voltage.

Detected radiation can be reported to a user by using a sound, light, a vibration, an image, or the like, for example. That is, the energy ray detector 1 may include a speaker not illustrated, for example, as a reporting unit (reporting means) and may report, to a user, detection of radiation using a sound, such as a voice, music, or a warning beep, from the speaker. The energy ray detector 1 may include a reporting light output unit not illustrated, such as a pilot lamp, for example, as the reporting unit (reporting means) and may report, to a user, detection of radiation using light. Alternatively, the energy ray detector 1 may include a vibration unit (vibration means) as the reporting unit (reporting means) and may report, to a user, detection of radiation using vibration. Note that the number of reporting units (reporting means) is not limited to one, and a plurality of reporting units may be provided. In other words, as the reporting unit, at least one of the above-described reporting means may be provided.

Note that, in this embodiment, the electric currents that flow through the TFTs 20 of the respective pixels Sx are summed up (totalized) to thereby detect the sum of the amounts of change in the electric currents that flow through the TFTs 20 of all of the pixels Sx (the total amount of change). However, detection in this embodiment is not limited to this. All of the pixels Sx may be grouped into unit areas each determined on the basis of a plurality of source lines, and the electric currents that flow through the TFTs 20 of the plurality of pixels Sx that constitute each unit area may be summed up (totalized) to thereby detect the sum of the amounts of change in the electric currents that flow through the TFTs 20 of the plurality of pixels Sx.

<Effects>

As described above, in this embodiment, the overall configuration of the entire energy ray detector 1, and the basic idea and the principle of energy ray detection in terms of the overview of the invention are the same as in the first embodiment. Therefore, similar effects as in the first embodiment can be attained.

In this embodiment, as described above, the sum of changes in properties of the TFTs 20 in the respective pixels Sx is detected to thereby amplify the amount of change. As a result, the presence or absence of radiation and the radiation dose can be detected with certainty from a very small radiation dose smaller than that in the first embodiment.

Further, according to this embodiment, a radiation dose that exceeds a threshold or the presence or absence of radiation can be detected from $I_{sum}$, as described above. In this case, the number of components can be reduced and an analysis process can be simplified compared to the first embodiment. In a case where radiation that exceeds a certain threshold is applied, system control can be performed in which on-off control is performed on the radiation source (an X-ray tube, for example) and an excess portion of radiation having an amount more than necessary for detection can be cut to thereby reduce radiation exposure.

[Third Embodiment]

Yet another embodiment of the present invention is described below with reference to FIGS. 10(a) and 10(b). Here, differences between this embodiment and the first and second embodiments are described. Constituent elements having the same functions as the constituent elements used in the first and second embodiments are given the same reference numerals, and description thereof is omitted.

In a capacitor element formed by using a transistor that has an active layer formed of a semiconductor, when radiation is applied to the capacitor element, the capacitance value linearly transitions in accordance with the amount of applied radiation.

Therefore, by detecting, as the amount of change in an electrical property of the semiconductor, the amount of change (amount of transition) in the capacitance value of the capacitor element formed by using the transistor having an active layer formed of a semiconductor, the radiation dose can be determined from the amount of change in the capacitance value.

<Overall Configuration of Energy Ray Detector 1>

Figure 10:
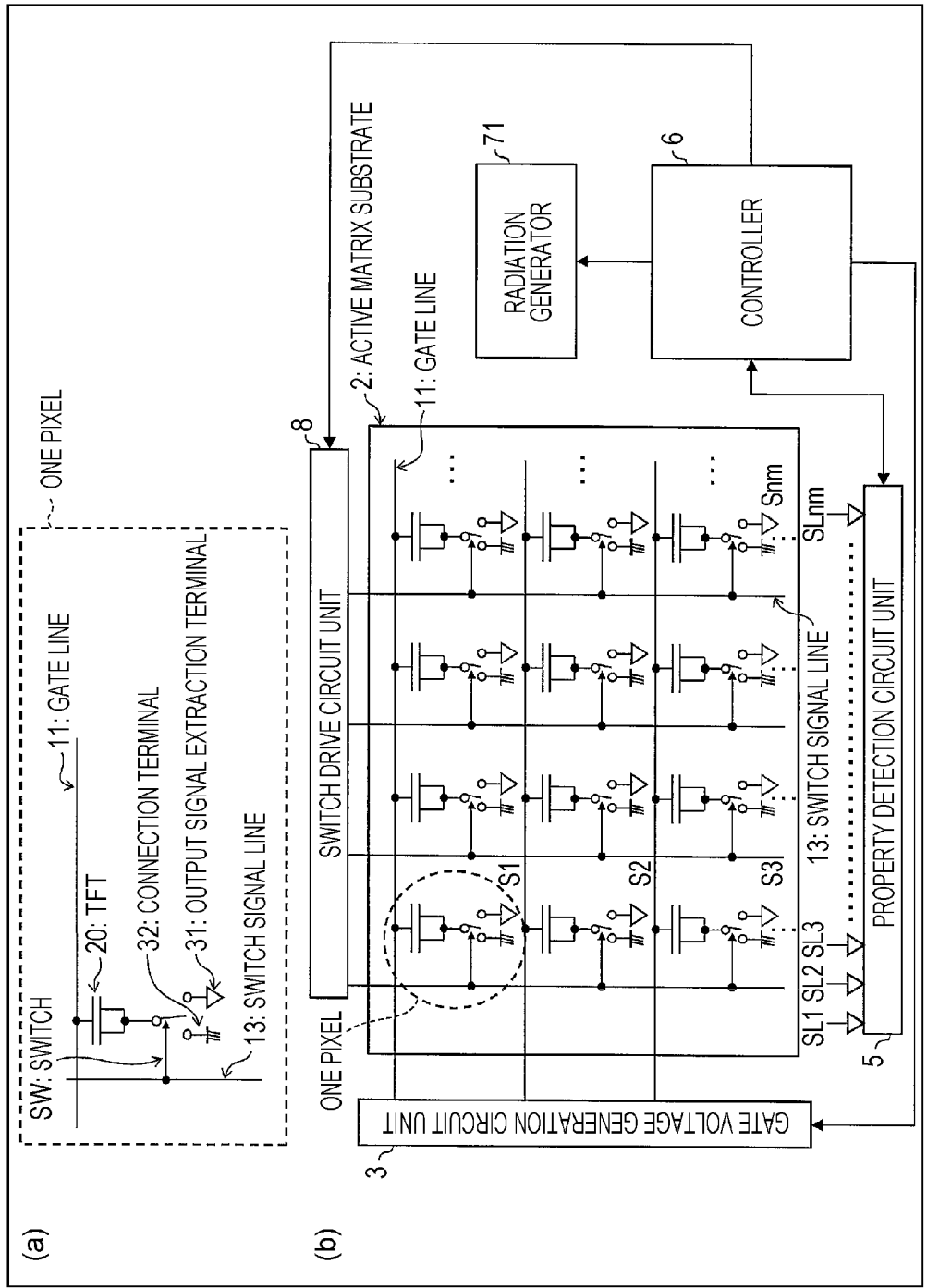
FIG. 10(a) is a circuit diagram illustrating a basic circuit configuration of one pixel in the energy ray detector according to a third embodiment.
FIG. 10(b) is a block diagram illustrating an example of the overall configuration of the energy ray detector according to the third embodiment.

FIG. 10(a) is a circuit diagram illustrating a basic circuit configuration of one pixel in the energy ray detector 1 according to this embodiment, and FIG. 10(b) is a block diagram illustrating an example of the overall configuration of the energy ray detector 1 according to this embodiment.

As illustrated in FIG. 10(b), the energy ray detector 1 according to this embodiment includes the active matrix substrate 2, the gate voltage generation circuit unit 3 and a switch drive circuit unit 8 that function as a drive circuit, the property detection circuit unit 5, and the controller 6. The energy ray detector 1 according to this embodiment may be a system that further includes a radiation generator 71.

Also in this embodiment, the active matrix substrate 2 includes a plurality (n×m pieces) of pixels S1 to Snm (n and m each represent any integer equal to or larger than 1) arranged in a grid pattern and is formed in a substantially square shape as illustrated in FIG. 10(b), for example.

As illustrated in FIG. 10(b), the pixels Sx on the active matrix substrate 2 each include electrode lines in an XY matrix constituted by one of the plurality (n lines) of gate lines 11 and one of a plurality (m lines) of switch signal lines 13 (sensor row selection lines), the TFT 20, the output signal extraction terminal 31, and a grounding terminal 32.

Also in this embodiment, the gate lines 11 are connected to the gate voltage generation circuit unit 3. The switch signal lines 13 are connected to the switch drive circuit unit 8.

In the TFT 20, the source electrode S and the drain electrode D are short-circuited to thereby form a gate-source/drain capacitance (hereinafter simply referred to as "capacitance") between the gate electrode G, and the source electrode S and the drain electrode D.

The gate electrode G of the TFT 20 is connected to the gate line 11, and the source electrode S and the drain electrode D are connected to a switch Sw.

The switch Sw switches the connection destination of the source electrode S and the drain electrode D to one of the output signal extraction terminal 31 and the grounding terminal 32 in accordance with a signal from the switch drive circuit unit 8.

The switch drive circuit unit 8 sends, to the switch Sw provided in each pixel Sx via the switch signal line 13, a signal for switching the connection destination of the switch Sw.

The output signal extraction terminal 31 of each pixel Sx is connected to one of the signal lines SL1 to SLnm of the property detection circuit unit 5.

In the property detection circuit unit 5, a capacitance detection circuit is provided. The capacitance detection circuit is constituted by a charge sensing amplifier or a circuit that measures the amount of transition in the resonance frequency or the phase, for example. However, the capacitance detection circuit is not limited to this and may be constituted by a circuit that detects the capacitance using a method different from the above-described method.

The charge sensing amplifier is constituted by an operational amplifier and a capacitor element, for example, integrates and amplifies electric charges while retaining the electric charges in the capacitor element, and outputs an electric signal. Note that the capacitance value is measured at the capacitor element included in each pixel Sx and represents the presence or absence of radiation incident on a specific capacitor element and the radiation dose.

In the circuit that measures the amount of transition in the resonance frequency or the phase, a feedback circuit is formed between a read circuit formed of a self-oscillation circuit, a gain change correction circuit, and an amplifier, and a capacitor element formed by using a transistor, and detects the amount of transition in the resonance frequency or the phase before and after application of radiation.

Specifically, in the feedback circuit, positive feedback is produced if the gain is equal to 1 and the phase condition is equal to 0, and resonance at a specific frequency occurs. However, when the capacitance value transitions due to application of radiation and the resonance frequency changes, the phase difference is not equal to 0, and the gain is smaller than the gain at the resonance frequency. Therefore, the gain and phase conditions for the feedback circuit are not satisfied, and oscillation from the self-oscillation stops. However, if the resonance frequency is adjusted in the gain change correction circuit, and control is performed in the feedback circuit so that the phase difference becomes 0, oscillation is resumed. As a result, the frequency difference and the amount of transition in the phase before and after application of radiation are detected (measured) in the feedback circuit.

<Method for Detecting Radiation>

Now, a method for detecting radiation performed by the energy ray detector 1 according to this embodiment is described together with the functions of the controller 60 and the configuration of the storage unit 50.

First, electric charges stored in the capacitor are removed, and the capacitance of the TFT 20 is detected.

Specifically, the switch Sw provided in each pixel Sx is switched to the position of the grounding terminal 32 in accordance with a signal from the switch drive circuit unit 8 to thereby ground the source electrode S and the drain electrode D of each TFT 20. Accordingly, electric charges stored in the capacitor are removed.

Next, the switch Sw provided in each pixel Sx is switched to the position of the output signal extraction terminal 31 in accordance with a signal from the switch drive circuit unit 8 to thereby connect the source electrode S and the drain electrode D of each TFT 20 to the output signal extraction terminal 31 and consequently to the property detection circuit unit 5 via the output signal extraction terminal 31. Accordingly, the capacitance value of the TFT 20 of each pixel Sx is measured. The capacitance value when no radiation is present is compared with the capacitance value when radiation is present as in the first and second embodiments, and the amount of change (amount of transition) in the capacitance value is detected.

When radiation is applied to the energy ray detector 1, the capacitance value of the capacitor element formed by using the transistor provided in each pixel Sx changes in accordance with the radiation dose. Also in this embodiment, the amount of electric charges retained in each capacitor element in response to an input voltage from the gate line 11 is extracted through one of the signal lines SL1 to SLnm. As a result, the radiation dose and a radiograph that passes through an object can be obtained in two dimensions, for example. In this embodiment, electric charges stored in each capacitor element are sent to the property detection circuit unit 5 and are read as a signal.

In the property detection circuit unit 5, the capacitance detection circuit is provided as described above, and the capacitance value of the TFT 20 of each pixel Sx can be read.

In this case, if a charge sensing amplifier is used for the capacitance detection circuit as described above, electric charges can be integrated and amplified while being retained in the capacitor element, and can be output as an electric signal.

Instead of directly reading the capacitance value, a feedback circuit may be formed between a read circuit formed of a self-oscillation circuit, a gain change correction circuit, and an amplifier, and a capacitor element formed by using a transistor, and the amount of transition in the resonance frequency or the phase before and after application of radiation may be measured as described above, for example, to thereby detect a two-dimensional distribution of the radiation dose and the values of the amounts of radiation applied to the pixels Sx, which are sources used to reconstruct, in image processing, a radiograph that passes through an object.

The second storage unit 52 stores a relationship between the amount of change in the capacitance value and the radiation dose.

The radiation dose detection unit in the energy ray detection processing unit 61 detects the radiation dose corresponding to the amount of change in the capacitance value detected by the property detection circuit unit 5 on the basis of the relationship between the amount of change in the capacitance value and the radiation dose stored in the second storage unit 52.

In a case where the capacitance detection circuit detects the capacitance value of the TFT 20 of each pixel Sx as an electrical property of the TFT 20, the amount of change in an electrical property of the TFT 20 can be determined as in the first embodiment by storing the capacitance value of the TFT 20 of each pixel Sx before application of radiation in the first storage unit 51.

That is, also in this embodiment, the amount-of-change detection unit may use the first storage unit 51 to detect the amount of change in the capacitance value from the capacitance values of the TFT 20 of each pixel Sx before and after application of radiation detected by the property detection circuit unit 5. A method for detecting the radiation dose from the amount of change in the capacitance value is the same as in the case of detecting the amount of change in the capacitance value of the TFT 20 in the capacitance detection circuit.

In the case of using the capacitor element as the radiation detection element as in this embodiment, when radiation is applied to the active layer of the transistor that constitutes the capacitor element, optically induced carriers (electron-positive hole pairs) are serially produced, and the capacitance value transitions in accordance with the amount of applied radiation.

As a result, the capacitance value of a transistor located in the pixel Sx to which a large amount of radiation is applied transitions to a large degree, that of a transistor located in the pixel Sx in which the radiation dose is small transitions to a small degree, and the amount of transition linearly changes in accordance with the amount of applied radiation. Therefore, it is possible to detect the radiation dose in a wide area with certainty from a very small radiation dose also in this embodiment.

The energy ray detector 1 according to this embodiment does not require a charge time unlike the related art, and therefore, enables high-speed reading of information. Further, the sensitivity to radiation (S/N ratio) is high, and therefore, the radiation application time can be shorter and the radiation exposure can be reduced.

In order to increase the resolution, the pixel size is reduced. If the capacitance value of the capacitor element decreases in accordance with the reduction in the pixel size, the amount of electric charges in each pixel Sx decreases. Accordingly, the amount of electric charges markedly varies among the pixels Sx due to varying leakage currents of the transistors, and it is difficult to keep data accurate. By using an oxide semiconductor having an extremely small leakage current as the semiconductor, as described above, the capacitance value of each pixel Sx can be accurately measured even if the detection device has a large area.

In this embodiment, the capacitance of the capacitor provided in each pixel Sx is set so that the capacitor can retain electric charges for a predetermined period by taking into consideration the leakage current or the like of the transistor provided in the pixel Sx.

For example, by using a capacitor element formed by using a transistor having an active layer formed of an oxide semiconductor, the capacitance value may be equal to or smaller than one-half, and preferably one-fifth, of that of a conventional capacitor element formed of amorphous silicon. As a result, the pixel size can be reduced, and the aperture ratio of the cell can be made higher.

According to this embodiment, the capacitance value can be decreased, and therefore, in a case of forming a feedback circuit as described above, for example, the resonance point of the feedback circuit can be set as desired in accordance with the system specifications.

In this embodiment, the case is described, for example, where, on the basis of the amount of change in the capacitance value of the TFT 20 of each pixel Sx, the radiation dose corresponding to the amount of change is detected; however, detection in this embodiment is not limited to this.

For example, also in this embodiment, the presence or absence of radiation that exceeds a threshold may be detected from the amount of change in the capacitance value of the TFT 20 of each pixel Sx, or the amount of change in the sum of the capacitance values of the pixels Sx may be detected to thereby amplify the radiation dose and detect a very small radiation dose, as described in the second embodiment.

In the case where the energy ray detector 1 includes the radiation generator 71 (energy ray generator) as described above, for example, if radiation that exceeds a certain threshold is applied, system control may be performed in which on-off control is performed on the radiation source (an X-ray tube, for example) of the radiation generator 71.

In this embodiment, the case is described, for example, where the output signal extraction terminal 31 and the grounding terminal 32 are provided in each pixel Sx; however, this embodiment is not limited to this configuration.

For example, one grounding terminal 32 may be provided for all pixels or for every several pixels. Grounding is necessary for removing electric charges stored in the capacitors. When the grounding terminal 32 is shared by the TFTs 20 in this manner, the area of the active matrix substrate 2 used by the switches Sw for selection can be reduced.

The output signal extraction terminal 31 may be shared by the TFTs 20, and output values from the TFTs 20, that is, the capacitance values or the amounts of change in the capacitance values, may be read in a time-division manner.

In order to prevent reduction in the aperture ratio of the pixel Sx, an electrode is provided in each pixel Sx, and each TFT 20 may be connected to a switching element shared by the TFTs 20 via a wire.

<Effects>

As described above, also in this embodiment, the basic idea and the principle of energy ray detection in terms of the overview of the invention are the same as in the first and second embodiments.

Therefore, similar effects as in the first and second embodiments can be attained.

[Fourth Embodiment]

Yet another embodiment of the present invention is described below with reference to FIGS. 11(*a*) and 11(*b*) and FIG. 12. Here, differences between this embodiment and the first to third embodiments are described. Constituent elements having the same functions as the constituent elements used in the first to third embodiments are given the same reference numerals, and description thereof is omitted.

It is desirable that an insulating material having excellent radiation resistance be used for the insulating substrate 10. In the first embodiment, a glass substrate is used as the insulating substrate 10, for example.

In this embodiment, other examples of the configuration of the insulating substrate in the active matrix substrate 2 are described.

<First Example>

Figure 11:
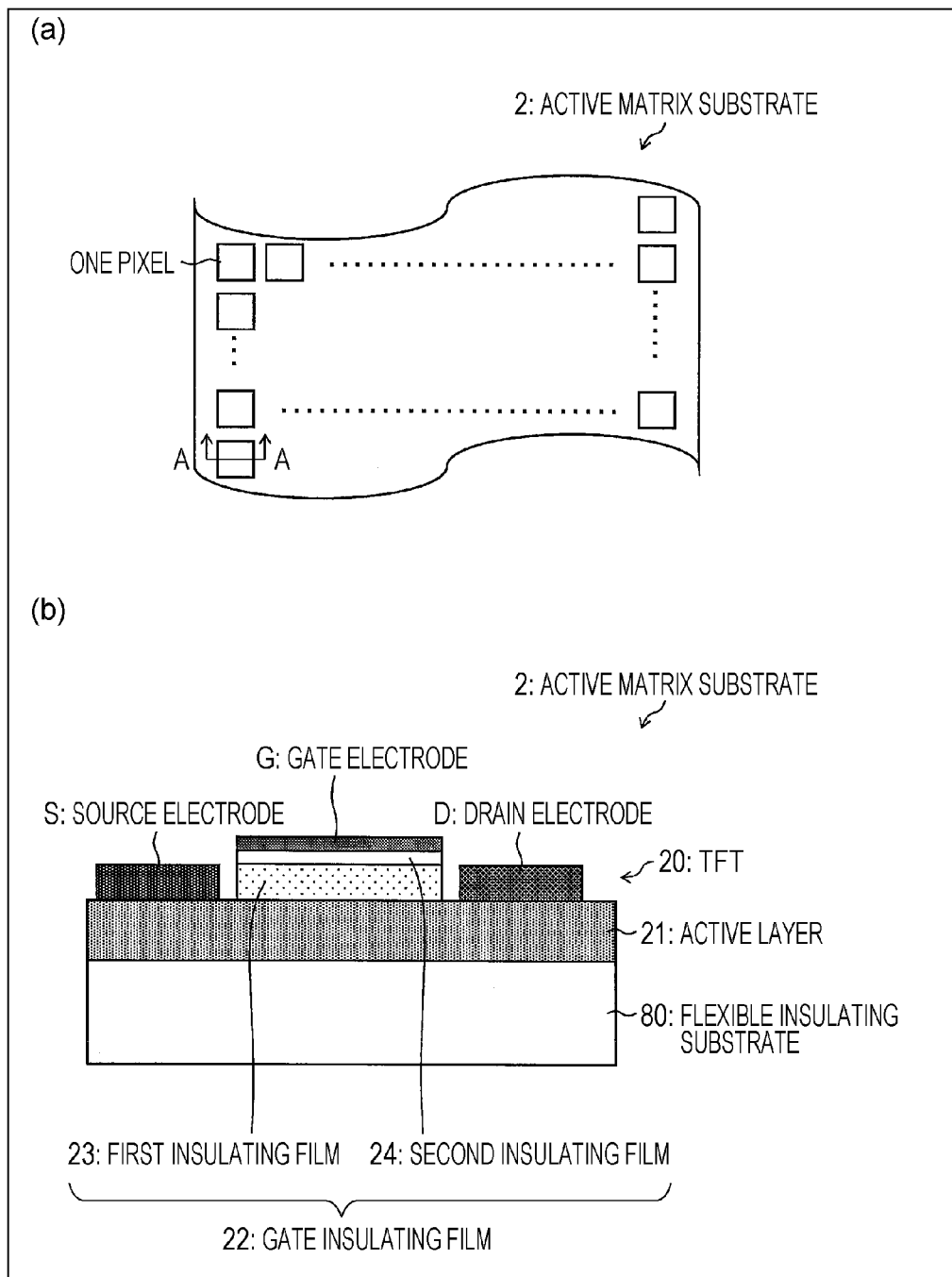
FIG. 11(a) is a plan view illustrating an overall configuration of a principal part of the energy ray detector according to a first example in a fourth embodiment.
FIG. 11(b) is a cross-sectional view taken along line A-A of an active matrix substrate illustrated in FIG. 11(a).

FIG. 11(*a*) is a plan view illustrating an overall configuration of a principal part of the energy ray detector 1 according to this example, and FIG. 11(*b*) is a cross-sectional view taken along line A-A of the active matrix substrate 2 illustrated in FIG. 11(*a*). Note that FIG. 11(*b*) illustrates a cross-section of one pixel illustrated in FIG. 11(*a*).

As described above, it is desirable that the semiconductor used for the active layer of the transistor be an oxide semiconductor. Properties of an oxide semiconductor are less likely to be affected by alkali ions, in principle. Therefore, for the insulating substrate used as the base substrate of the active matrix substrate, the insulation property and flatness need to be ensured, in principle.

Further, with an oxide semiconductor used for the active layer of the transistor, a film can be formed at a low temperature.

Accordingly, in a case of using an oxide semiconductor for the active layer 21 of the TFT 20, the TFT 20 that is flexible can be formed on a flexible insulating substrate 80, which is a film, a resin sheet made of polyethylene or the like, a plastic sheet, or the like and which is flexible due to an organic material or a high-molecular material, as illustrated in FIG. 11(*b*).

As described above, an organic semiconductor material can be used for the active layer 21 of the TFT 20 regardless of whether the material is of a low-molecular type or a high-molecular type. Even in this case where an organic semiconductor material is used for the active layer 21 of the TFT 20, the TFT 20 that is flexible can be formed on the flexible insulating substrate 80, which is a film, a resin sheet made of polyethylene or the like, a plastic sheet, or the like and which is flexible due to an organic material or a high-molecular material, as illustrated in FIG. 11(*b*).

<Effects>

As described above, according to this example, a film, a resin sheet made of polyethylene or the like, a plastic sheet, and the like, which are generally considered to be difficult to use for an active matrix substrate, can be used. Therefore, according to this example, the energy ray detector 1 that is lighter and thinner than conventional detection devices and that is flexible can be implemented. Accordingly, the energy ray detector 1 according to this example can be used as a non-flat-type energy ray detector, for example.

It is supposed that the energy ray detector 1 having flexibility as described above can be used for industrial purposes in addition to medical purposes.

For example, the energy ray detector 1 according to this example can be preferably used at a place where complex and overlapping pipes, wires, and so on are laid in a limited narrow area, such as on a pipe in a nuclear power plant, a plant, a vessel, or a machine, an engine room in a vehicle, a vessel, or an aircraft, and so on.

The energy ray detector 1 according to this example is flexible, and thinner and lighter than conventional semiconductor detection devices, and therefore, can be interposed between complex pipes or wires to check a radiograph of only a target portion.

[Second Example]

Figure 12:
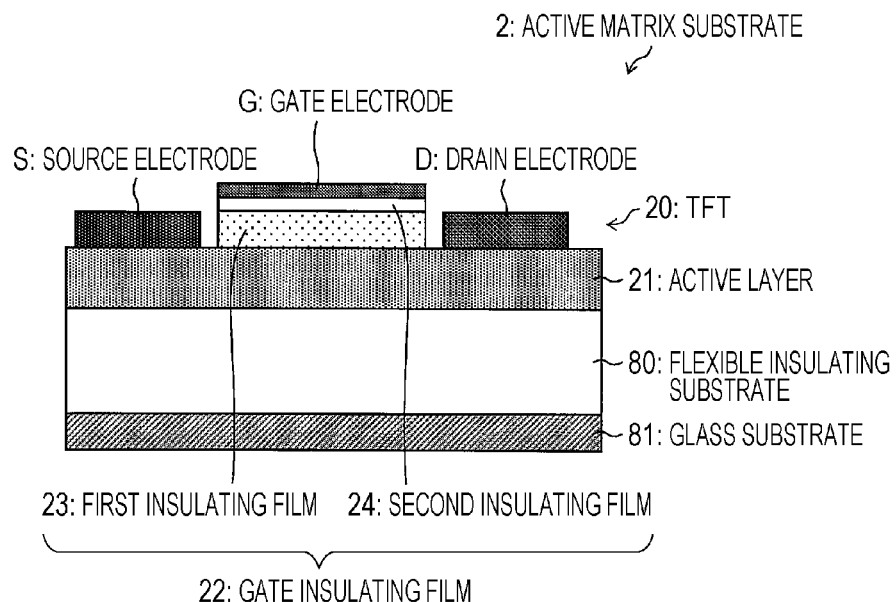
FIG. 12 is a cross-sectional view illustrating an overall configuration of a principal part of the energy ray detector according to a second example in the fourth embodiment.

FIG. 12 is a cross-sectional view illustrating an overall configuration of a principal part of the energy ray detector 1 according to this example.

The energy ray detector 1 according to this example includes, as the insulating substrate of the active matrix substrate 2, an insulating substrate constituted by a glass substrate 81 formed of a thin glass sheet and the flexible insulating substrate 80 bonded together, as illustrated in FIG. 12.

Note that, for the flexible insulating substrate 80, a substrate made of an organic material or a high-molecular material having flexibility can be used as described above, for example.

When the glass substrate 81 and the flexible insulating substrate 80 are bonded together, with an oxide semiconductor used for the active layer 21 of the TFT 20, a film can be formed at a low temperature. Therefore, a configuration may be employed in which the flexible insulating substrate 80 and the glass substrate 81 are stacked in this order from the side of the active layer 21 as illustrated in FIG. 12, or a configuration may be employed in which the glass substrate 81 and the flexible insulating substrate 80 are stacked in this order from the side of the active layer 21

<Effects>

According to this example, the flexible insulating substrate 80, which is a film, a resin sheet made of polyethylene or the like, a plastic sheet, or the like, is used as part of the insulating substrate. Therefore, also in this example, the energy ray detector 1 that is lighter and thinner than conventional detection devices can be implemented.

[Fifth Embodiment]

Examples of devices in which the energy ray detector 1 according to the first to fourth embodiments is used are described below with reference to FIG. 13 to FIG. 19.

As described above, when the energy ray detector 1 according to the first to fourth embodiments is used, information regarding radiation, such as the presence or absence of radiation and the radiation dose, can be detected as information regarding energy ray radiation as described in the first to fourth embodiments.

For example, when the energy ray detector 1 according to the first to fourth embodiments is used, the distribution of the radiation dose on a radiation detection surface can be measured. Therefore, if the distribution is processed as an image, a radiograph can be created. Accordingly, the energy ray detector 1 can be used to monitor X radiographs.

Hereinafter, a case is mainly described, for example, where an energy-ray-applied body located on the semiconductors of the active matrix substrate 2 is assumed to be an object, energy ray radiation that passes through the object is detected, and the energy distribution of the energy ray radiation is created.

Examples of using the energy ray detector 1 according to the first to fourth embodiments are described below.

<General Medical X-ray Imaging Apparatus>

Figure 13:
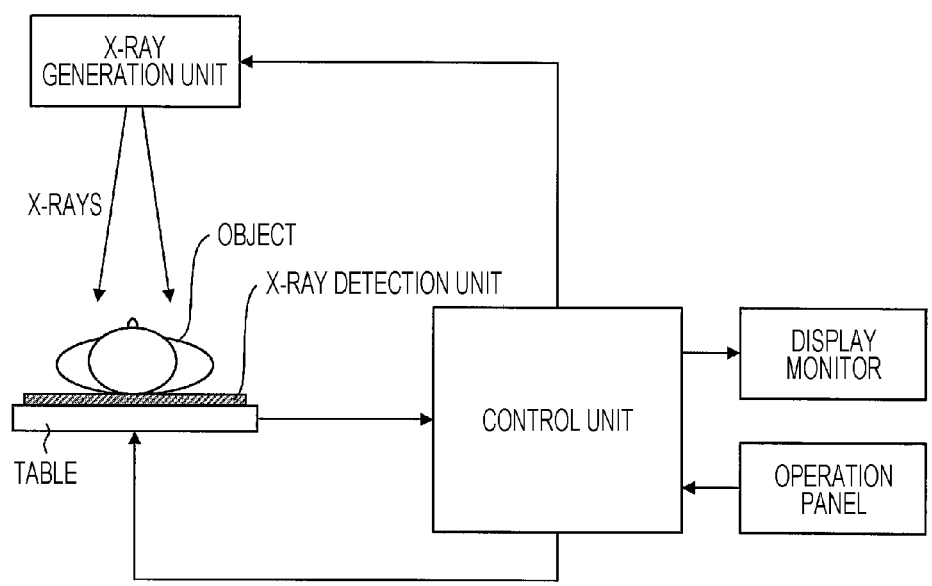
FIG. 13 is a schematic diagram illustrating an example of the overall configuration of a general medical X-ray imaging apparatus according to a fifth embodiment.

FIG. 13 is a schematic diagram illustrating an example of the overall configuration of a general medical X-ray imaging apparatus according to this embodiment.

The general medical X-ray imaging apparatus illustrated in FIG. 13 includes a control unit, an X-ray detection unit, an X-ray generation unit, a display monitor, an operation panel, a table, and so on.

The energy ray detector 1 may be the general medical X-ray imaging apparatus illustrated in FIG. 13 or part thereof. In this case, the X-ray detection unit can be constituted by the active matrix substrate 2 and its peripheral circuits (for example, the gate voltage generation circuit unit 3, the reference voltage generation circuit unit 4, the switch drive circuit unit 8, and so on), the control unit can be constituted by the controller 6, and the X-ray generation unit can be constituted by the radiation generator 71, for example.

Note that the energy ray detector 1 may be used as the X-ray detection unit or as the X-ray detection unit and the control unit.

As described above, the controller 6 includes the control unit 60, and the control unit 60 controls the entire energy ray detector 1. Control other than the control performed by the energy ray detection processing unit 61 is similar to control performed by publicly known general medical X-ray imaging apparatuses, and therefore, description thereof is omitted herein.

Examples of the above-described general medical X-ray imaging apparatus include an X-ray machine, a dental X-ray machine, a C-arm, an angiography machine, and so on. However, examples are not limited to these machines in this embodiment, and the above-described general medical X-ray imaging apparatus can be widely used for the purposes of detecting radiation including an X-ray and can be used for other medical purposes than the above-described purposes.

<Medical CT (Computerized Tomography) Apparatus>

Figure 14:
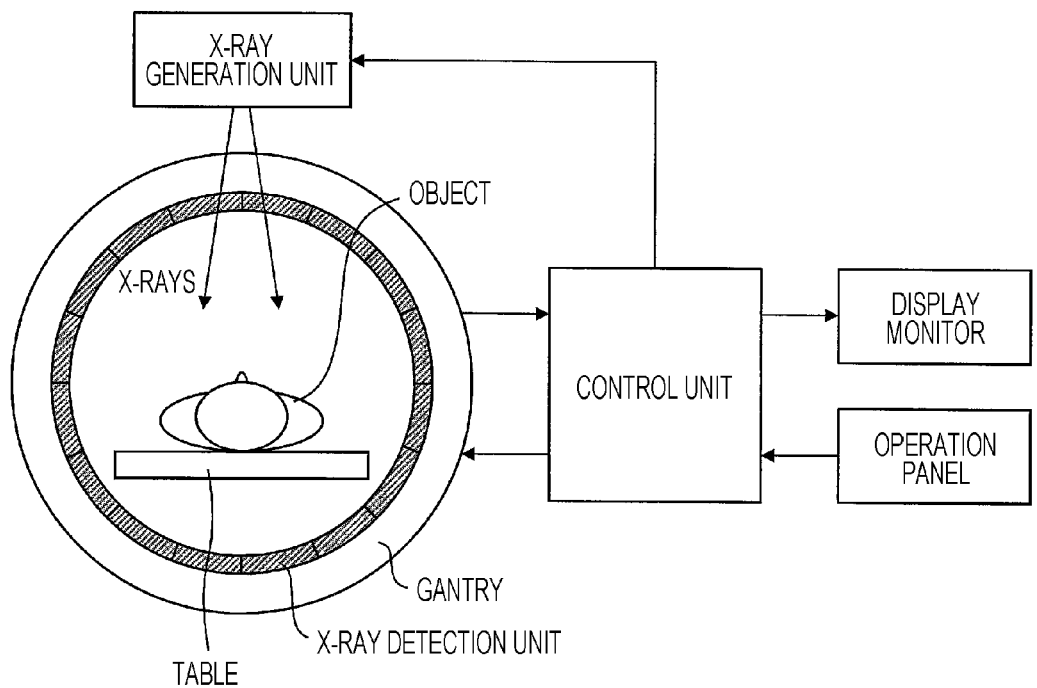
FIG. 14 is a schematic diagram illustrating an example of the overall configuration of a medical CT apparatus according to the fifth embodiment.

FIG. 14 is a schematic diagram illustrating an example of the overall configuration of a medical CT apparatus according to this embodiment.

The medical CT apparatus illustrated in FIG. 14 includes a control unit, an X-ray detection unit, an X-ray generation unit, a display monitor, an operation panel, a gantry, a table, and so on.

The energy ray detector 1 may be the medical CT apparatus illustrated in FIG. 14 or part thereof. Also in this case, the X-ray detection unit can be constituted by the active matrix substrate 2 and its peripheral circuits, the control unit can be constituted by the controller 6, and the X-ray generation unit can be constituted by the radiation generator 71, for example.

Also in this example, the energy ray detector 1 may be used as the X-ray detection unit or as the X-ray detection unit and the control unit.

Also in this case, as described above, the controller 6 includes the control unit 60, and the control unit 60 controls the entire energy ray detector 1. Control other than the control performed by the energy ray detection processing unit 61 is similar to control performed by publicly known medical CT apparatuses, and therefore, description thereof is omitted herein.

<Industrial CT Apparatus>

Figure 15:
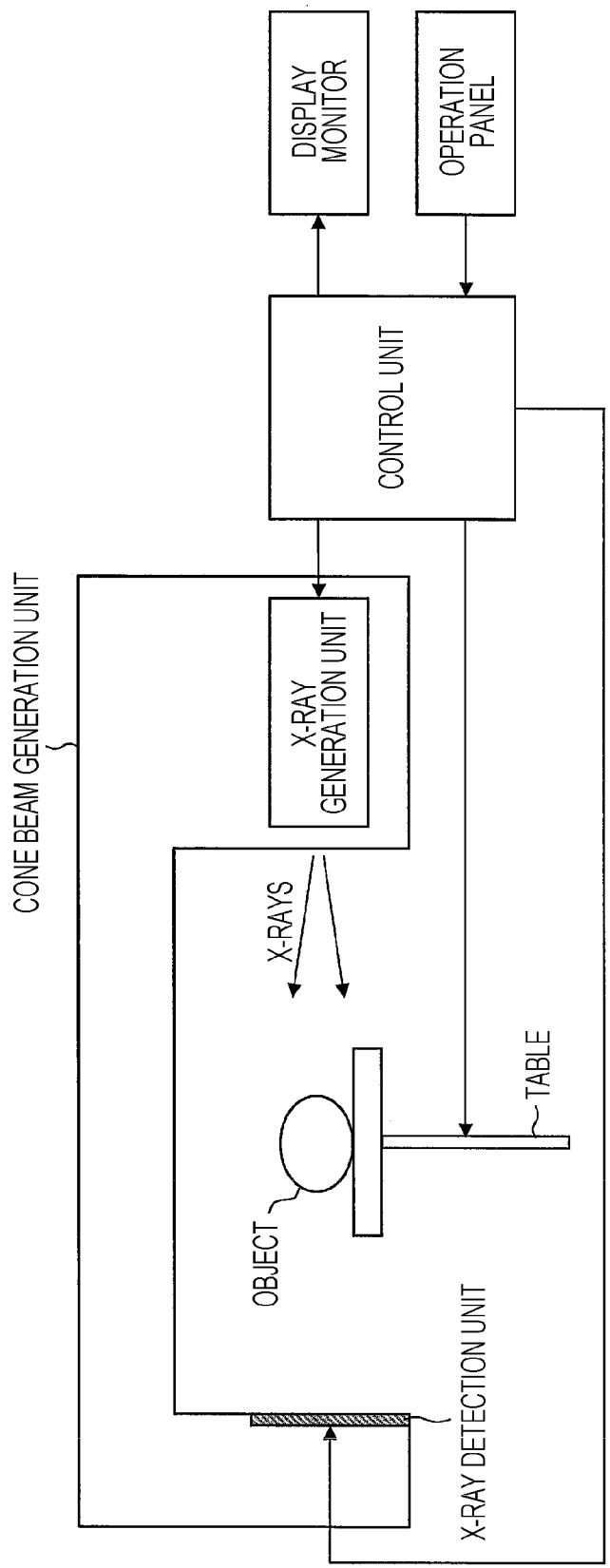
FIG. 15 is a schematic diagram illustrating an example of the overall configuration of an industrial CT apparatus according to the fifth embodiment.

FIG. 15 is a schematic diagram illustrating an example of the overall configuration of an industrial CT apparatus according to this embodiment.

The industrial CT apparatus illustrated in FIG. 15 includes a control unit, an X-ray detection unit, an X-ray generation unit, a display monitor, an operation panel, a cone beam generation unit, a table, and so on.

The energy ray detector 1 may be the industrial CT apparatus illustrated in FIG. 15 or part thereof. Also in this case, the X-ray detection unit can be constituted by the active matrix substrate 2 and its peripheral circuits, the control unit can be constituted by the controller 6, and the X-ray generation unit can be constituted by the radiation generator 71, for example.

Also in this example, the energy ray detector 1 may be used as the X-ray detection unit or as the X-ray detection unit and the control unit.

Also in this case, as described above, the controller 6 includes the control unit 60, and the control unit 60 controls the entire energy ray detector 1. Control other than the control performed by the energy ray detection processing unit 61 is similar to control performed by publicly known industrial CT apparatuses, and therefore, description thereof is omitted herein.

<Mammography Machine>

Figure 16:
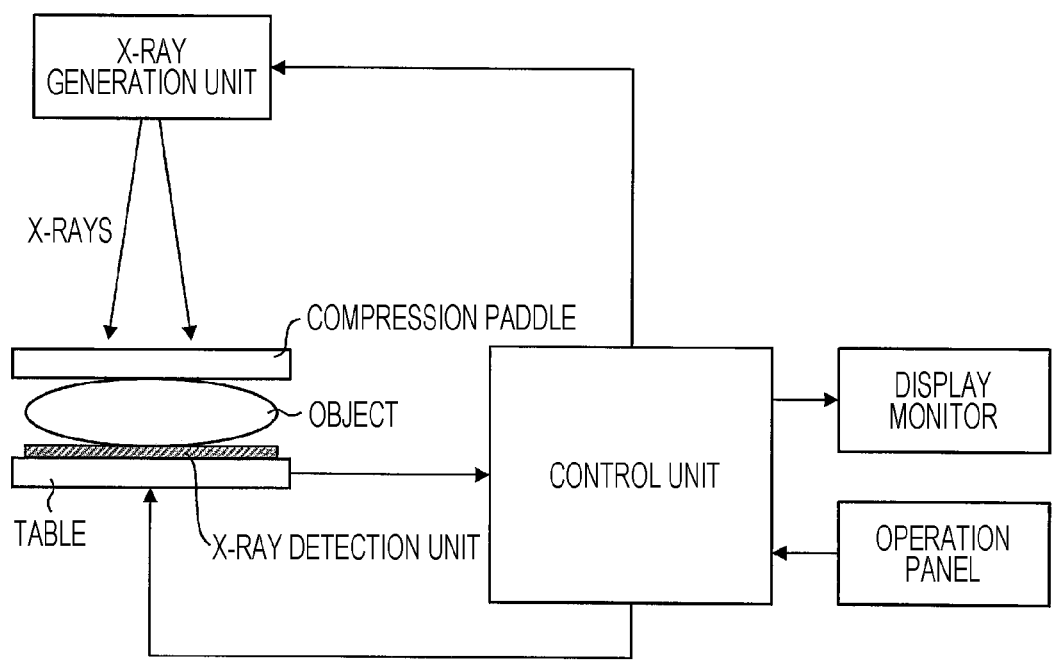
FIG. 16 is a schematic diagram illustrating an example of the overall configuration of a mammography machine according to the fifth embodiment.

FIG. 16 is a schematic diagram illustrating an example of the overall configuration of a mammography machine according to this embodiment.

The mammography machine illustrated in FIG. 16 includes a control unit, an X-ray detection unit, an X-ray generation unit, a display monitor, an operation panel, a table, a compression paddle, and so on.

The energy ray detector 1 may be the mammography machine illustrated in FIG. 16 or part thereof. Also in this case, the X-ray detection unit can be constituted by the active matrix substrate 2 and its peripheral circuits, the control unit can be constituted by the controller 6, and the X-ray generation unit can be constituted by the radiation generator 71, for example.

Also in this example, the energy ray detector 1 may be used as the X-ray detection unit or as the X-ray detection unit and the control unit.

Also in this case, as described above, the controller 6 includes the control unit 60, and the control unit 60 controls the entire energy ray detector 1. Control other than the control performed by the energy ray detection processing unit 61 is similar to control performed by publicly known mammography machines, and therefore, description thereof is omitted herein.

<Baggage Inspection Apparatus>

Figure 17:
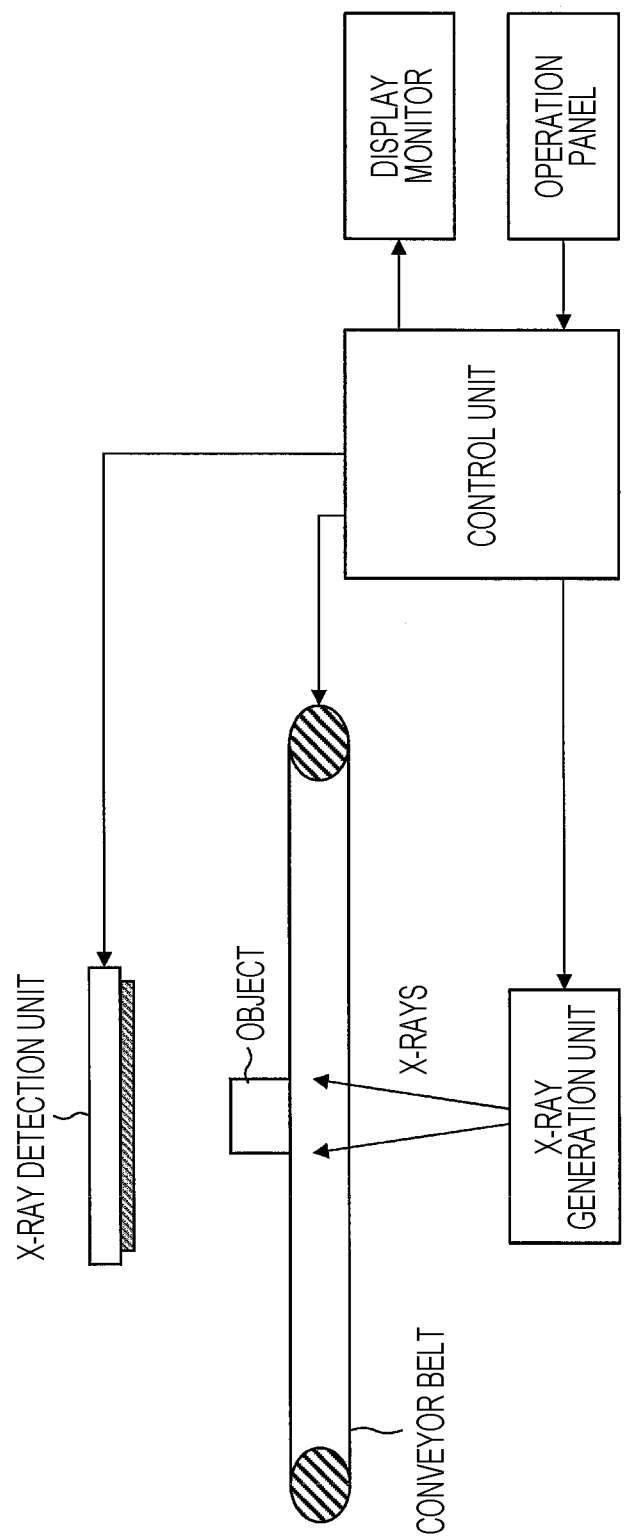
FIG. 17 is a schematic diagram illustrating an example of the overall configuration of a baggage inspection apparatus according to the fifth embodiment.

FIG. 17 is a schematic diagram illustrating an example of the overall configuration of a baggage inspection apparatus according to this embodiment.

The baggage inspection apparatus illustrated in FIG. 17 includes a control unit, an X-ray detection unit, an X-ray generation unit, a display monitor, an operation panel, a conveyor belt, and so on.

The energy ray detector 1 may be the baggage inspection apparatus illustrated in FIG. 17 or part thereof. Also in this case, the X-ray detection unit can be constituted by the active matrix substrate 2 and its peripheral circuits, the control unit can be constituted by the controller 6, and the X-ray generation unit can be constituted by the radiation generator 71, for example.

Also in this example, the energy ray detector 1 may be used as the X-ray detection unit or as the X-ray detection unit and the control unit.

Also in this case, as described above, the controller 6 includes the control unit 60, and the control unit 60 controls the entire energy ray detector 1. Control other than the control performed by the energy ray detection processing unit 61 is similar to control performed by publicly known baggage inspection apparatuses, and therefore, description thereof is omitted herein.

<Nondestructive Inspection Apparatus>

Figure 18:
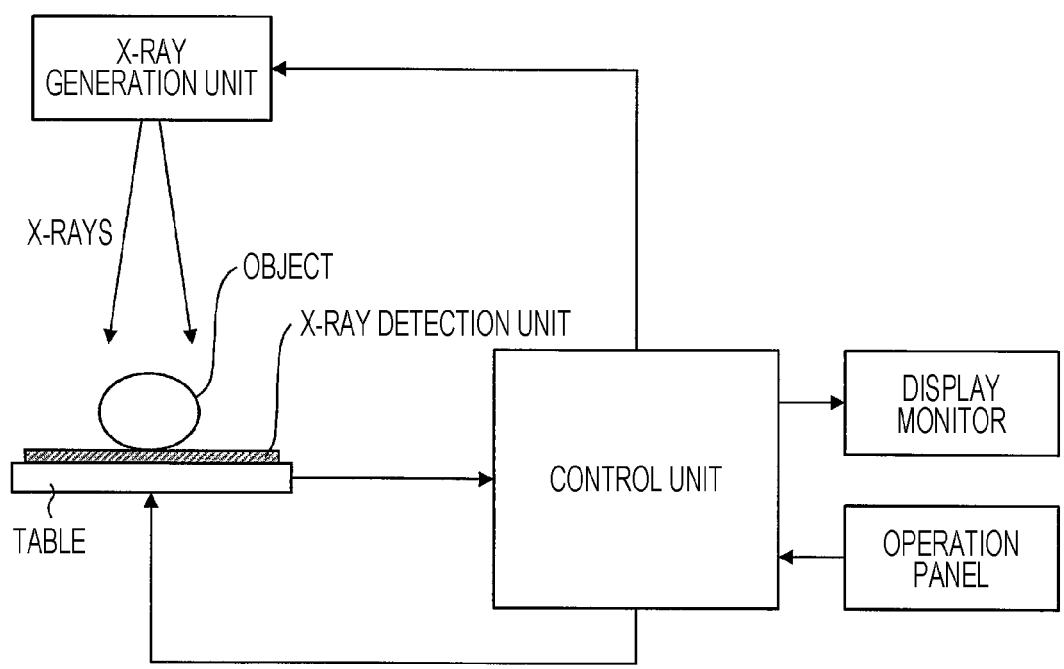
FIG. 18 is a schematic diagram illustrating an example of the overall configuration of a nondestructive inspection apparatus according to the fifth embodiment.

FIG. 18 is a schematic diagram illustrating an example of the overall configuration of a nondestructive inspection apparatus according to this embodiment.

The nondestructive inspection apparatus illustrated in FIG. 18 includes a control unit, an X-ray detection unit, an X-ray generation unit, a display monitor, an operation panel, and so on.

The energy ray detector 1 may be the nondestructive inspection apparatus illustrated in FIG. 18 or part thereof. Also in this case, the X-ray detection unit can be constituted by the active matrix substrate 2 and its peripheral circuits, the control unit can be constituted by the controller 6, and the X-ray generation unit can be constituted by the radiation generator 71, for example.

Also in this example, the energy ray detector 1 may be used as the X-ray detection unit or as the X-ray detection unit and the control unit.

Also in this case, as described above, the controller 6 includes the control unit 60, and the control unit 60 controls the entire energy ray detector 1. Control other than the control performed by the energy ray detection processing unit 61 is similar to control performed by publicly known nondestructive inspection apparatuses, and therefore, description thereof is omitted herein.

<Dosimeter>

FIG. 19 is a schematic diagram illustrating an example of the overall configuration of a dosimeter according to this embodiment.

The dosimeter illustrated in FIG. 19 includes an X-ray detection unit, a case, and so on. The dosimeter illustrated in FIG. 19 may include a reporting unit (reporting means), such as a display monitor (not illustrated), for reporting the X-ray dose or the presence or absence of an X-ray, an operation panel (not illustrated), and so on.

That is, the above-described dosimeter may include a display monitor, for example, as the reporting unit and may include a speaker, a pilot lamp, a vibration source, and so on.

The energy ray detector 1 may be the dosimeter illustrated in FIG. 19 or part thereof, and the X-ray detection unit may be constituted by using the energy ray detector 1, for example.

Also in this case, as described above, the controller 6 includes the control unit 60, and the control unit 60 controls the entire energy ray detector 1. Control other than the control performed by the energy ray detection processing unit 61 is similar to control performed by publicly known dosimeters, and therefore, description thereof is omitted herein.

As described above, the energy ray detector 1 can be a flexible energy ray detector, and therefore, can be mounted on a portable dosimeter, such as a portable film badge, a portable terminal (portable information terminal), or the like or can be used as such a portable dosimeter.

In FIG. 19, a portable dosimeter is illustrated, for example; however, the energy ray detector 1 can be used for stationary dosimeters as a matter of course.

The above examples are merely examples, and the energy ray includes an energy ray other than an X-ray as a matter of course.

As described above, the energy ray detector 1 measures the sum of the electric currents that flow through the semiconductors of the pixels Sx, for example, and therefore, the amount of change in an electrical property (the amount of the electric current that flows through the transistor, for example) in response to very weak radiation can be multiplied by the number of pixels. Accordingly, the energy ray detector 1 is applicable to measurement of very weak radiation performed by a dosimeter or the like.

In this case, if the radiation dose corresponding to the sum of the amounts of change in an electrical property is measured in advance, for example, the amount of radiation applied to the semiconductors of the pixels Sx and the amount of radiation applied per unit area can be calculated.

Accordingly, the energy ray detector 1 according to one aspect of the present invention can be preferably used as any of various electronic devices, such as radiation inspection devices, used to detect energy ray radiation or as an energy ray detection device mounted on such electronic devices, as described above.

By using the energy ray detector 1 designed in accordance with one aspect of the present invention as an energy ray detection unit or as an energy ray detection device, various electronic devices, such as radiation inspection devices for medical purposes or industrial purposes, which require detection of energy ray radiation, can be provided.

This embodiment can be combined with any other embodiments as appropriate.

In the above description, the present invention is described with reference to preferable embodiments of the present invention; however, the present invention should not be interpreted while being limited to these embodiments. The scope of the present invention should be interpreted on the basis of the scope of claims, and a person skilled in the art can implement an equivalent scope from the description of the specific preferable embodiments of the present invention on the basis of the description of the present invention and the common general technical knowledge. It is understood that the content of the literature cited herein is specifically described herein and should be quoted as a reference for this description similarly.

[Conclusion]

The energy ray detector 1 according to a first mode of the present invention includes semiconductors (for example, the semiconductors that constitute the TFTs 20 or the diode-connected TFTs 91) that are arranged in a grid pattern and that have an electrical property changing in accordance with the amounts of applied energy ray radiation, and a detection unit (for example, the property detection circuit unit 5 or 7 and the controller 6) that detects information regarding the energy ray radiation from changes in the electrical property of the semiconductors.

In the energy ray detector 1 according to a second mode of the present invention, in the first mode, the detection unit may detect the amounts of change in the electrical property of the semiconductors as the changes in the electrical property of the semiconductors and may detect, from the amounts of change, the amounts of energy ray radiation applied to the semiconductors as the information regarding the energy ray radiation.

In the energy ray detector 1 according to a third mode of the present invention, in the first or second mode, the detection unit may obtain, from the changes in the electrical property of the semiconductors, an energy distribution of the energy ray radiation applied to thesemiconductors as the information regarding the energy ray radiation.

The energy ray detector 1 according to a fourth mode of the present invention may, in the third mode, further include a display unit (for example, a display monitor) that visually displays the energy distribution.

In the energy ray detector 1 according to a fifth mode of the present invention, in any of the first to fourth modes, the detection unit may detect an energy distribution of energy ray radiation that passes through an energy-ray-applied body located on the semiconductors.

In the energy ray detector 1 according to a sixth mode of the present invention, in the first mode, the detection unit may detect, from the changes in the electrical property of the semiconductors, the presence or absence of the energy ray radiation as the information regarding the energy ray radiation.

In the energy ray detector 1 according to a seventh mode of the present invention, in the first mode, the detection unit may detect the information regarding the energy ray radiation from the sum of the amounts of change in the electrical property of some of the semiconductors.

Note that the sum of the amounts of change in the electrical property of some of the semiconductors may be the sum of the amounts of change in the electrical property of all of the semiconductors or may be the sum of the amounts of change in the electrical property in units of pluralities of semiconductors. That is, the detection unit may detect the information regarding the energy ray radiation from the sum of the amounts of change in the electrical property of all of the semiconductors, for example.

In the energy ray detector 1 according to an eighth mode of the present invention, in the first or seventh mode, the detection unit may detect, from the sum of the amounts of change in the electrical property of some of the semiconductors, the amount of energy ray radiation applied per unit area as the information regarding the energy ray radiation.

In the energy ray detector 1 according to a ninth mode of the present invention, in any of the first to eighth modes, the semiconductor may have an active layer formed of an oxide semiconductor.

In the energy ray detector 1 according to a tenth mode of the present invention, in the first or seventh mode, the detection unit may detect, from the sum of the amounts of change in the electrical property of some of the semiconductors, the presence or absence of the energy ray radiation that exceeds a threshold as the information regarding the energy ray radiation.

In the energy ray detector 1 according to an 11th mode of the present invention, in the first or seventh mode, the detection unit may detect, from the sum of the amounts of change in the electrical property of some of the semiconductors, the sum of the amounts of energy ray radiation applied to some of the semiconductors as the information regarding the energy ray radiation.

The energy ray detector 1 according to a 12th mode of the present invention may, in any of the first, second, and sixth to 11th modes, further include a reporting unit (for example, a display monitor) that reports the information regarding the energy ray radiation.

In the energy ray detector 1 according to a 13th mode of the present invention, in the 12th mode, the reporting unit may report the information regarding the energy ray radiation by using at least one of a sound, light, a vibration, and an image.

In the energy ray detector 1 according to a 14th mode of the present invention, in the 12th or 13th mode, the reporting unit may include a display unit (for example, a display monitor) that visually displays the information regarding the energy ray radiation.

In the energy ray detector 1 according to a 15th mode of the present invention, in any of the first to 14th modes, the semiconductors may be formed on a flexible insulating substrate (the flexible insulating substrate 80).

In the energy ray detector 1 according to a 16th mode of the present invention, in any of the first to 15th modes, the semiconductor may constitute a semiconductor element (for example, the TFT 20, the diode 91).

In the energy ray detector 1 according to a 17th mode of the present invention, in the 16th mode, the electrical property may correspond to the electric current that flows through the semiconductor.

In the energy ray detector 1 according to an 18th mode of the present invention, in the 16th or 17th mode, the electrical property may correspond to the on-state current of the semiconductor element.

In the energy ray detector 1 according to a 19th mode of the present invention, in the 16th or 17th mode, the electrical property may correspond to the off-state current of the semiconductor element.

In the energy ray detector 1 according to a 20th mode of the present invention, in the 16th mode, the electrical property may correspond to the transconductance of the semiconductor element.

In the energy ray detector 1 according to a 21st mode of the present invention, in the 16th mode, the electrical property may correspond to the threshold voltage of the semiconductor element.

In the energy ray detector 1 according to a 22nd mode of the present invention, in any of the first to 15th modes, the semiconductor may constitute a capacitor element (for example, a capacitor element formed by using the TFT 20 or the diode 91) that stores electric charges.

In the energy ray detector 1 according to a 23rd mode of the present invention, in the 22nd mode, the electrical property may correspond to the capacitance of the capacitor element.

In the energy ray detector 1 according to a 24th mode of the present invention, in the 22nd or 23th mode, the capacitor element may be formed by using a semiconductor element (for example, the TFT 20, the diode 91).

In the energy ray detector 1 according to a 25th mode of the present invention, in any of the 16th to 21st and 24th modes, the semiconductor element may be a transistor (for example, the TFT 20).

In the energy ray detector 1 according to a 26th mode of the present invention, in any of the 16th to 21st and 24th modes, the semiconductor element may be a diode (for example, the diode 91).

In the energy ray detector 1 according to a 27th mode of the present invention, in any of the 16th to 21st and 24th to 26th modes, the semiconductor element may include the gate insulating film 22 that has a layered structure including the first insulating film 23 and the second insulating film 24.

In the energy ray detector 1 according to a 28th mode of the present invention, in the 27th mode, the first insulating film 23 may contain nitrogen and silicon, and the second insulating film 24 may contain oxygen and silicon.

In the energy ray detector 1 according to a 29th mode of the present invention, in any of the 16th to 21st and 24th to 28th modes, the film thickness of the active layer 21 of the semiconductor element may be 1 μm or less.

In the energy ray detector 1 according to a 30th mode of the present invention, in any of the 16th to 21st and 24th to 29th modes, the crystal structure of the active layer 21 of the semiconductor element may be a monocrystalline structure.

In the energy ray detector 1 according to a 31st mode of the present invention, in any of the 16th to 21st and 24th to 30th modes, the crystal structure of the active layer 21 of the semiconductor element may be a non-monocrystalline structure.

In the energy ray detector 1 according to a 32nd mode of the present invention, in any of the 16th to 21st and 24th to 29th modes, the crystal structure of the active layer 21 of the semiconductor element may be a non-monocrystalline amorphous structure.

In the energy ray detector 1 according to a 33rd mode of the present invention, in any of the 16th to 21st and 24th to 29th modes, the crystal structure of the active layer 21 of the semiconductor element may be a non-monocrystalline polycrystalline structure.

In the energy ray detector 1 according to a 34th mode of the present invention, in any of the 16th to 21st and 24th to 29th modes, the crystal structure of the active layer 21 of the semiconductor element may include an amorphous material that is partially crystalline.

In the energy ray detector 1 according to a 35th mode of the present invention, in any of the 16th to 21st and 24th to 29th modes, the active layer 21 of the semiconductor element may have an amorphous oxide containing at least one of an In—Zn—Ga—O-based oxide, an In—Zn—Ga—Mg—O-based oxide, an In—Zn—O-based oxide, an In—Sn-based oxide, an In—O-based oxide, an In—Ga—O-based oxide, and an Sn—In—Zn—O-based oxide.

In the energy ray detector 1 according to a 36th mode of the present invention, in the 35th mode, the amorphous oxide may be at least partially made of an amorphous oxide, and the electron carrier concentration may be $10^{18}/cm^3$.

In the energy ray detector 1 according to a 37th mode of the present invention, in the 35th or 36th mode, the semiconductor element may include the gate electrode G, the source electrode S, and the drain electrode D, and at least one electrode among the gate electrode G, the source electrode S, and the drain electrode D may be formed of an oxide.

In the energy ray detector 1 according to a 38th mode of the present invention, in any of the 16th to 21st and 24th to 26th modes, the semiconductor element may include the gate insulating film 22 that contains silicon and oxygen.

In the energy ray detector 1 according to a 39th mode of the present invention, in any of the 16th to 21st and 24th to 26th modes, the semiconductor element may include the gate insulating film 22 that contains silicon and nitrogen.

In the energy ray detector 1 according to a 40th mode of the present invention, in the 27th mode, the first insulating film 23 may contain nitrogen, oxygen, and silicon and contain more nitrogen than oxygen, and the second insulating film 24 may contain nitrogen, oxygen, and silicon and contain more oxygen than nitrogen.

In the energy ray detector 1 according to a 41st mode of the present invention, in any of the 27th, 28th and 40th modes, the first insulating film 23 may have a film thickness thicker than the film thickness of the second insulating film 24.

In the energy ray detector 1 according to a 42nd mode of the present invention, in any of the 16th to 21st, 24th to 36th, and 38th to 41st modes, the semiconductor element may include the gate electrode G made of a gate electrode material that contains at least one of TaN, TaC, TiN, TiCN, TiAlN, W, WN, and Mo.

In the energy ray detector 1 according to a 43rd mode of the present invention, in any of the 16th to 21st modes, the electrical property of the semiconductors may be output to the detection unit via signal lines connected to the semiconductor elements.

In the energy ray detector 1 according to a 44th mode of the present invention, in any of the 16th to 21st and 24th to 42nd modes, the detection unit may detect the changes in the electrical property of the semiconductors by chronologically detecting the electrical property of the semiconductors.

In the energy ray detector 1 according to a 45th mode of the present invention, in the first mode, the semiconductor may be a semiconductor element (for example, the TFT 20, the diode 91), and a drive voltage (gate voltage) applied to the semiconductor element may be adjusted so that the semiconductor element is in the off state when energy ray radiation is not applied to the semiconductor element and so that the semiconductor element is in the on state when energy ray radiation is applied to the semiconductor element.

As described above, the present invention is not limited to the above-described embodiments. Various modifications can be made within the scope of claims. Any embodiment obtained by combining technical means disclosed in different embodiments as appropriate is also included in the technical scope of the present invention. Further, technical means disclosed in the embodiments can be combined to form a new technical feature.

INDUSTRIAL APPLICABILITY

The energy ray detector according to the present invention can be used to detect an energy ray, such as radiation.

REFERENCE SIGNS LIST

1 energy ray detector
2 active matrix substrate
3 gate voltage generation circuit unit
4 reference voltage generation circuit unit
5 property detection circuit unit (detection unit)
6 controller (detection unit)
7 property detection circuit unit
8 switch drive circuit unit
10 insulating substrate
11 gate line
12 source line
13 switch signal line
20 TFT (semiconductor element)
21 active layer
22 gate insulating film
23 first insulating film
24 second insulating film
31 output signal extraction terminal
32 grounding terminal
41 electric current-voltage conversion circuit
42 A/D converter
50 storage unit
51 first storage unit
52 second storage unit
60 controller (detection unit)
60 control unit (detection unit)
61 energy ray detection processing unit (detection unit)
71 radiation generator
80 flexible insulating substrate
81 glass substrate
91 diode
G gate electrode
S source electrode
D drain electrode
S1 to Snm pixel
SL1 to SLnm signal line
Sw switch

The invention claimed is:
1. An energy ray detector comprising:
semiconductor elements that are arranged in a grid pattern, each semiconductor element among the semicon- ductor elements having an active layer formed of an oxide semiconductor, the active layer having a property changing in accordance with an amount of applied energy ray radiation; and a detection unit that, from a relationship between a rate of increase in an electric current flowing through the semiconductor element due to the changing property of the active layer and the amount of energy ray radiation, determines an amount of energy ray radiation corresponding to rates of increase in electric currents flowing through the semiconductor elements by performing a calculation according to the relationship.

2. The energy ray detector according to claim 1, wherein the detection unit obtains an energy distribution of the energy ray radiation applied to the semiconductor elements.

3. The energy ray detector according to claim 2, further comprising:

a display unit that visually displays the energy distribution.

4. The energy ray detector according to claim 1, wherein the detection unit detects, from the sum of amounts of change in electrical property of some of the semiconductor elements, an amount of energy ray radiation applied per unit area as information regarding the energy ray radiation.

5. The energy ray detector according to claim 1, wherein the semiconductor element is a transistor.

6. An energy ray detector comprising:

semiconductor elements that are arranged in a grid pattern, each semiconductor element among the semiconductor elements having an active layer formed of an oxide semiconductor, the active layer having a property changing in accordance with an amount of applied energy ray radiation; and a detection unit that, from a relationship between a rate of increase in an electric current flowing through the semiconductor element due to the changing property of the active layer and the amount of energy ray radiation, detects presence or absence of energy ray radiation having a predetermined amount or more according to the relationship.

7. The energy ray detector according to claim 6, wherein the detection unit obtains an energy distribution of the energy ray radiation applied to the semiconductor elements.

8. The energy ray detector according to claim 7, further comprising:

a display unit that visually displays the energy distribution.

9. The energy ray detector according to claim 6, wherein the semiconductor element is a transistor.

10. An energy ray detector comprising:

a plurality of semiconductor elements that are arranged in a grid pattern, each of the plurality of semiconductor elements having an active layer made of an oxide semiconductor whose property changes in accordance with an amount of irradiated energy ray;

a detection unit configured to (a) concurrently measure electric currents flowing through the respective plurality of semiconductor elements and (b) calculate, based on a relationship between (i) a rate of increase in an electric current flowing through each of the plurality of semiconductor elements, which rate of increase is changed in accordance with a change in property of the active layer, and (ii) each amount of irradiated energy ray of a corresponding one of the plurality of semiconductor elements, the each amount being changed in accordance with the change in the property of the active layer according to the relationship.

11. The energy ray detector according to claim 10, wherein the detection unit finds an energy distribution of the amounts of irradiated energy ray of the respective plurality of semiconductor elements.

12. An energy ray detector according to claim 11, further comprising a display unit configured to visualize the energy distribution.

13. The energy ray detector according to claim 10, wherein the detection unit finds, as information regarding the energy ray, an amount, per unit area, of irradiated energy ray based on the sum of amounts of changes in electrical properties of the respective plurality of semiconductor elements.

14. The energy ray detector according to claim 10 wherein the semiconductor element is a transistor.

* * * * *